United States Patent
Laghi et al.

(10) Patent No.: US 11,231,441 B2
(45) Date of Patent: Jan. 25, 2022

(54) MEMS STRUCTURE FOR OFFSET MINIMIZATION OF OUT-OF-PLANE SENSING ACCELEROMETERS

(71) Applicant: INVENSENSE, INC., San Jose, CA (US)

(72) Inventors: Giacomo Laghi, Milan (IT); Matthew Julian Thompson, Beaverton, OR (US); Luca Coronato, Corsico (IT); Roberto Martini, Milan (IT)

(73) Assignee: INVENSENSE, INC., San Jose, CA (US)

( * ) Notice: Subject to any disclaimer, the term of this patent is extended or adjusted under 35 U.S.C. 154(b) by 100 days.

(21) Appl. No.: 16/842,619

(22) Filed: Apr. 7, 2020

(65) Prior Publication Data
US 2020/0233011 A1   Jul. 23, 2020

Related U.S. Application Data

(60) Continuation-in-part of application No. 16/673,602, filed on Nov. 4, 2019, now abandoned, which is a
(Continued)

(51) Int. Cl.
*G01P 15/125* (2006.01)
*B81B 7/00* (2006.01)
*G01P 15/08* (2006.01)

(52) U.S. Cl.
CPC .......... *G01P 15/125* (2013.01); *B81B 7/0016* (2013.01); *B81B 2203/0307* (2013.01); *G01P 2015/0831* (2013.01)

(58) Field of Classification Search
CPC .......... G01P 15/125; G01P 2015/0831; B81B 3/0086; B81B 7/0016; B81B 2201/025; B81B 2203/0307
See application file for complete search history.

(56) References Cited

U.S. PATENT DOCUMENTS

| 4,372,162 A * | 2/1983 | Shutt | G01P 15/125 |
| | | | 318/651 |
| 4,398,417 A * | 8/1983 | Shutt | G01P 15/125 |
| | | | 73/497 |

(Continued)

FOREIGN PATENT DOCUMENTS

| CN | 1816747 A | 8/2006 |
| CN | 102435773 A | 5/2012 |

(Continued)

OTHER PUBLICATIONS

Non-Final Office Action received for U.S. Appl. No. 14/714,149 dated Aug. 11, 2017 99 pages.
(Continued)

*Primary Examiner* — David J Bolduc
(74) *Attorney, Agent, or Firm* — Amin, Turocy & Watson, LLP

(57) ABSTRACT

Exemplary embodiment of a tilting z-axis, out-of-plane sensing MEMS accelerometers and associated structures and configurations are described. Disclosed embodiments facilitate improved offset stabilization. Non-limiting embodiments provide exemplary MEMS structures and apparatuses characterized by one or more of having a sensing MEMS structure that is symmetric about the axis orthogonal to the springs or flexible coupling axis, a spring or flexible coupling axis that is aligned to one of the symmetry axes of the electrodes pattern, a different number of reference electrodes and sense electrodes, a reference MEMS structure having at least two symmetry axes, one which is along the axis of the springs or flexible coupling, and/or a reference structure below the spring or flexible coupling axis.

20 Claims, 19 Drawing Sheets

Related U.S. Application Data continuation of application No. 15/916,105, filed on Mar. 8, 2018, now Pat. No. 10,466,268, which is a division of application No. 14/714,149, filed on May 15, 2015, now Pat. No. 9,952,252.

(60) Provisional application No. 62/898,887, filed on Sep. 11, 2019.

(56) References Cited

U.S. PATENT DOCUMENTS

| | | | | |
|---|---|---|---|---|
| 4,398,418 A * | 8/1983 | Shutt | G01P 15/125 | 318/651 |
| 4,644,793 A * | 2/1987 | Church | G01C 19/5691 | 73/504.13 |
| 4,951,508 A * | 8/1990 | Loper, Jr. | G01C 19/5691 | 73/1.84 |
| 5,233,213 A * | 8/1993 | Marek | G01P 15/0802 | 257/415 |
| 5,343,765 A * | 9/1994 | Okada | G01L 5/165 | 73/862.043 |
| 5,383,362 A * | 1/1995 | Putty | G01C 19/5677 | 73/504.01 |
| 5,406,848 A * | 4/1995 | Okada | G01L 1/144 | 73/514.32 |
| 5,419,194 A * | 5/1995 | Varnham | G01C 19/5691 | 73/504.13 |
| 5,495,760 A * | 3/1996 | Wirt | G01C 19/5691 | 73/504.13 |
| 5,497,668 A * | 3/1996 | Okada | G01L 5/165 | 73/514.32 |
| 5,629,472 A * | 5/1997 | Varnham | G01C 19/5691 | 310/312 |
| 5,646,346 A * | 7/1997 | Okada | G01C 19/56 | 361/283.3 |
| 5,698,783 A * | 12/1997 | Murakoshi | G01C 19/24 | 73/504.03 |
| 5,712,426 A * | 1/1998 | Sapuppo | G01C 19/42 | 73/504.02 |
| 6,196,067 B1 * | 3/2001 | Martin | G01P 15/0802 | 73/514.32 |
| 6,257,062 B1 * | 7/2001 | Rich | G01P 15/0888 | 73/514.32 |
| 6,282,956 B1 * | 9/2001 | Okada | G01C 19/56 | 73/504.12 |
| 6,314,823 B1 * | 11/2001 | Okada | B81B 3/0021 | 73/862.043 |
| 6,370,954 B1 * | 4/2002 | Zerbini | G01P 15/097 | 73/514.01 |
| 6,508,124 B1 * | 1/2003 | Zerbini | B81B 3/0072 | 73/514.32 |
| 6,520,017 B1 * | 2/2003 | Schoefthaler | G01P 15/0888 | 73/514.02 |
| 6,546,799 B1 * | 4/2003 | Vigna | G01C 19/5712 | 73/504.12 |
| 7,134,340 B2 | 11/2006 | Samuels et al. | | |
| 7,549,334 B2 | 6/2009 | Cardarelli | | |
| 8,549,921 B2 * | 10/2013 | Schwarzelbach | G01P 15/0802 | 73/514.32 |
| 8,616,056 B2 * | 12/2013 | Sammoura | H01L 21/4846 | 73/504.13 |
| 8,631,700 B2 * | 1/2014 | Sammoura | G01C 19/5698 | 73/504.12 |
| 8,661,898 B2 * | 3/2014 | Watson | G01C 19/5691 | 73/504.12 |
| 8,852,984 B1 * | 10/2014 | Quevy | B81B 3/0062 | 438/50 |
| 9,599,471 B2 * | 3/2017 | Vohra | G01C 19/5684 | |
| 9,952,252 B2 | 4/2018 | Thompson et al. | | |
| 10,466,268 B2 | 11/2019 | Thompson et al. | | |
| 2002/0023492 A1 * | 2/2002 | Sakai | G01P 15/125 | 73/514.16 |
| 2002/0109207 A1 * | 8/2002 | Rich | G01P 15/0888 | 257/586 |
| 2002/0111031 A1 * | 8/2002 | Chase | G01P 15/125 | 438/712 |
| 2002/0143484 A1 * | 10/2002 | Chiesa | G01P 15/0888 | 702/94 |
| 2002/0189352 A1 | 12/2002 | Reeds, III et al. | | |
| 2003/0094881 A1 * | 5/2003 | Grade | H02N 1/008 | 310/309 |
| 2003/0159511 A1 * | 8/2003 | Zarabadi | G01P 15/0888 | 73/514.02 |
| 2003/0159512 A1 * | 8/2003 | Zarabadi | G01C 19/5712 | 73/514.12 |
| 2004/0211257 A1 * | 10/2004 | Geen | G01P 15/14 | 73/504.04 |
| 2004/0211258 A1 * | 10/2004 | Geen | G01C 19/5719 | 73/510 |
| 2004/0216523 A1 * | 11/2004 | Lehtonen | G01P 15/18 | 73/514.32 |
| 2006/0174704 A1 * | 8/2006 | Tsubaki | G01P 1/023 | 73/514.16 |
| 2007/0012109 A1 | 1/2007 | Okada | | |
| 2007/0164772 A1 * | 7/2007 | Win | G01P 15/125 | 73/514.16 |
| 2007/0245826 A1 * | 10/2007 | Cardarelli | G01C 19/5712 | 73/504.12 |
| 2008/0178675 A1 | 7/2008 | Okada | | |
| 2009/0095081 A1 * | 4/2009 | Nakatani | G01P 15/125 | 73/514.32 |
| 2009/0100930 A1 | 4/2009 | Coronato et al. | | |
| 2009/0107239 A1 * | 4/2009 | Nakatani | G01P 15/125 | 73/514.32 |
| 2009/0255339 A1 * | 10/2009 | McNeil | G01P 15/097 | 73/514.15 |
| 2010/0242606 A1 * | 9/2010 | Kanemoto | G01P 15/0802 | 73/514.38 |
| 2011/0023604 A1 * | 2/2011 | Cazzaniga | G01C 19/5712 | 73/514.32 |
| 2011/0162453 A1 * | 7/2011 | Wang | G01P 15/125 | 73/514.32 |
| 2012/0017681 A1 * | 1/2012 | Reinmuth | G01P 15/125 | 73/514.35 |
| 2012/0299130 A1 * | 11/2012 | Langereis | G01P 15/125 | 257/415 |
| 2013/0104654 A1 * | 5/2013 | Classen | G01P 15/125 | 73/514.16 |
| 2013/0192371 A1 * | 8/2013 | Rytkonen | G01P 15/18 | 73/514.32 |
| 2014/0007685 A1 * | 1/2014 | Zhang | G01P 15/125 | 73/514.32 |
| 2014/0102217 A1 * | 4/2014 | Inaba | G01P 15/097 | 73/862.59 |
| 2014/0137670 A1 * | 5/2014 | Hata | G01P 15/125 | 73/862.621 |
| 2014/0331787 A1 * | 11/2014 | Brookhuis | G01L 1/142 | 73/862.042 |
| 2014/0352431 A1 * | 12/2014 | Leclerc | G01C 19/5712 | 73/504.04 |
| 2015/0128701 A1 * | 5/2015 | Vohra | G01P 15/18 | 73/504.12 |
| 2015/0293141 A1 * | 10/2015 | Wu | G01P 15/125 | 73/504.12 |
| 2015/0301075 A1 * | 10/2015 | Yamanaka | B81B 3/0072 | 73/1.38 |
| 2015/0355222 A1 * | 12/2015 | Zhang | G01P 15/125 | 73/514.32 |
| 2016/0097791 A1 * | 4/2016 | Zhang | B81B 3/0021 | 73/514.32 |
| 2016/0169931 A1 * | 6/2016 | Tocchio | B81B 7/0048 | 73/514.01 |
| 2016/0334438 A1 | 11/2016 | Thompson et al. | | |
| 2016/0377648 A1 * | 12/2016 | Zhang | G01P 15/125 | 73/514.32 |
| 2017/0260039 A1 | 9/2017 | Thompson et al. | | |
| 2018/0031601 A1 * | 2/2018 | Anac | G01C 19/5726 | |
| 2018/0031602 A1 * | 2/2018 | Huang | G01P 15/125 | |

(56) References Cited

U.S. PATENT DOCUMENTS

| | | |
|---|---|---|
| 2018/0196082 A1 | 7/2018 | Thompson et al. |
| 2019/0049481 A1* | 2/2019 | Zhang .................... G01P 15/18 |
| 2019/0162747 A1 | 5/2019 | Thompson et al. |
| 2020/0048072 A1* | 2/2020 | Schelling ............ B81C 1/00666 |

FOREIGN PATENT DOCUMENTS

| | | |
|---|---|---|
| GB | 2 272 054 A | 5/1994 |
| GB | 2 310 284 A | 8/1997 |

OTHER PUBLICATIONS

Non-Final Office Action received for U.S. Appl. No. 15/609,757 dated Jun. 28, 2017, 26 pages.
Final Office Action received for U.S. Appl. No. 15/609,757 dated Nov. 9, 2018, 05 pages.
Non-Final Office Action received for U.S. Appl. No. 15/916,105 dated Jan. 11, 2019, 37 pages.
Li, "Search Report for CN Application# 20160103233356, pp. 1-2, dated Jun. 12, 2019".
Non-Final Office Action received for U.S. Appl. No. 16/842,619 dated Jan. 8, 2020, 35 pages.
Second Office Action received for Chinese Application Serial No. 201610323335.6 dated Jan. 6, 2020, 19 pages.
International Search Report and Wrilten Opinion dated Nov. 25, 2020 for PCT Application No. PCT/US2020/047195, 17 pages.
First Office Action received for Chinese Application Serial No. 201610323335.6 dated Jun. 12, 2019, 15 pages.

\* cited by examiner

MEMS STRUCTURE FOR OFFSET MINIMIZATION OF OUT-OF-PLANE SENSING ACCELEROMETERS

PRIORITY CLAIM

Under 35 U.S.C. 120, this application is a Continuation-in-Part application and claims priority to U.S. patent application Ser. No. 16/673,602, filed Nov. 4, 2019, entitled "OFFSET REJECTION ELECTRODES," which is a Continuation application to U.S. patent application Ser. No. 15/916,105, filed Mar. 8, 2018, entitled "OFFSET REJECTION ELECTRODES," now U.S. Pat. No. 10,466,268, which is a Divisional Application of U.S. patent application Ser. No. 14/714,149, filed May 15, 2015, entitled "OFFSET REJECTION ELECTRODES," now U.S. Pat. No. 9,952,252. In addition, this patent application claims priority to U.S. Provisional Patent Application Ser. No. 62/898,887, filed Sep. 11, 2019, entitled "MEMS STRUCTURE FOR OFFSET MINIMIZATION OF OUT-OF-PLANE SENSING ACCELEROMETERS." This application is also related to U.S. patent application Ser. No. 15/609,757, filed May 31, 2017, now U.S. Pat. No. 10,295,558, which is a Continuation-in-Part application of U.S. patent application Ser. No. 14/714,149, filed May 15, 2015, entitled "OFFSET REJECTION ELECTRODES," now U.S. Pat. No. 9,952,252. The entireties of the aforementioned references are incorporated herein by reference.

TECHNICAL FIELD

The disclosed subject matter relates to microelectromechanical system (MEMS) sensors, and more particularly, to MEMS sensors utilizing offset rejection electrodes.

BACKGROUND

Microelectromechanical system (MEMS) sensors experience a variety of undesirable forces that can come from the fabrication of the MEMS/complementary metal-oxide-semiconductor (CMOS) die, packaging of the die, operation over temperature, shock conditions, user assembly, and many others. These forces cause non-ideal conditions such as deviations in the parallel alignment between the MEMS sensor and an embedded sensing reference plane.

Offset minimization for MEMS accelerometers and substrate deformation rejection is typically addressed by MEMS sensor design considerations (e.g., anchor design, anchor placement, electrodes placement and pattern, process improvement, etc.). However, MEMS accelerometers offset stability is a key challenge, as specification limits are tightening over all the market segments (e.g., consumer, automotive, industrial, etc.), and stress tests are becoming more aggressive. For example, improved offset stability over different types of external loads (e.g. temperature, strain, etc.) is required to enable new applications on existing markets or to make MEMS-based inertial sensors suitable for new market segments.

It is thus desired to provide MEMS sensors that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

A system and method for reducing offset in a MEMS sensor are disclosed. In a first aspect, the system is a MEMS sensor that comprises a sensing reference plane, at least one anchor coupled to the sensing reference plane, at least one proof mass coupled to the at least one anchor, wherein one of the at least one proof mass moves under an external excitation, a pattern of sensing elements coupled between the sensing reference plane and the at least one proof mass to detect motion normal to the sensing reference plane, wherein the pattern of sensing elements shares at least three axes of polarity anti-symmetry, and a signal processing circuit to combine the pattern of sensing elements thereby providing an output proportional to the external excitation.

In a second aspect, the sensing reference plane is divided by two axes forming four quadrants on the sensing reference plane and the pattern of sensing elements comprises at least three sensing elements in each of the four quadrants.

In a third aspect, a method provides the MEMS sensors as described above in the first and the second aspects.

In another non-limiting aspect, further non-limiting embodiments provide exemplary MEMS structures and apparatuses characterized by one or more of having a sensing MEMS structure that is symmetric about the axis orthogonal to the springs or flexible coupling axis, a spring or flexible coupling axis that is aligned to one of the symmetry axes of the electrodes pattern, a different number of reference electrodes and sense electrodes, a reference MEMS structure having at least two symmetry axes, one which is along the axis of the springs or flexible coupling, and/or a reference structure below the spring or flexible coupling axis.

These and other embodiments are described in more detail below.

BRIEF DESCRIPTION OF THE DRAWINGS

Various non-limiting embodiments are further described with reference to the accompanying drawings, in which.

DETAILED DESCRIPTION

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein. The following description is presented to enable one of ordinary skill in the art to make and use the various disclosed embodiments and is provided in the context of a patent application and its requirements. Various modifications to the preferred embodiment and the generic principles and features described herein will be readily apparent to those skilled in the art. Thus, the disclosed subject matter is not intended to be limited to the embodiments shown but is to be accorded the widest scope consistent with the principles and features described herein.

Micro-electro-mechanical systems (MEMS) refers to a class of microscale devices fabricated using semiconductor-like processes and exhibiting mechanical characteristics such as the ability to move or deform. MEMS often, but not always, interact with electrical signals. A MEMS device may refer to a semiconductor device implemented as a micro-electromechanical system. A MEMS device includes mechanical elements and optionally includes electronics for sensing. MEMS devices include but are not limited to microscale gyroscopes, accelerometers, magnetometers, and pressure sensors.

In one embodiment, a MEMS sensor comprises a MEMS device, a sensing reference plane, and an anchor that connects the MEMS device to the sensing reference plane. MEMS sensors can experience undesirable forces during the fabrication and operation of the MEMS sensors. These undesirable forces include but are not limited to stresses from fabrication and packaging of the MEMS/CMOS die, operation over temperature, shock conditions, and user assembly which cause non-ideal conditions such as deviations in the parallel alignment between the MEMS device and the sensing reference plane.

There are at least two independent undesirable deviations of the parallel alignment between the MEMS device and the sensing reference plane that occur. Firstly, shear forces on the anchor cause the anchor to tilt relative to the sensing reference plane. Secondly, bending forces cause the sensing reference plane to curve relative to the MEMS device. Therefore, the gap $z(x,y)$ between sensing reference plane and the MEMS device varies with the x and y position and is described from the anchor center as a linear function and a non-linear curvature component per the following equation: $z(x,y)=gap+R(x,y)+Curv(NL(x,y))$; where the gap=ideal initial parallel gap, $R(x,y)$ is the rotation and $Curv(NL(x,y))$ is a mathematical description of the curvature that can be a polynomial, trigonometric series, power series or similar non-linear function or series.

Figure 1:
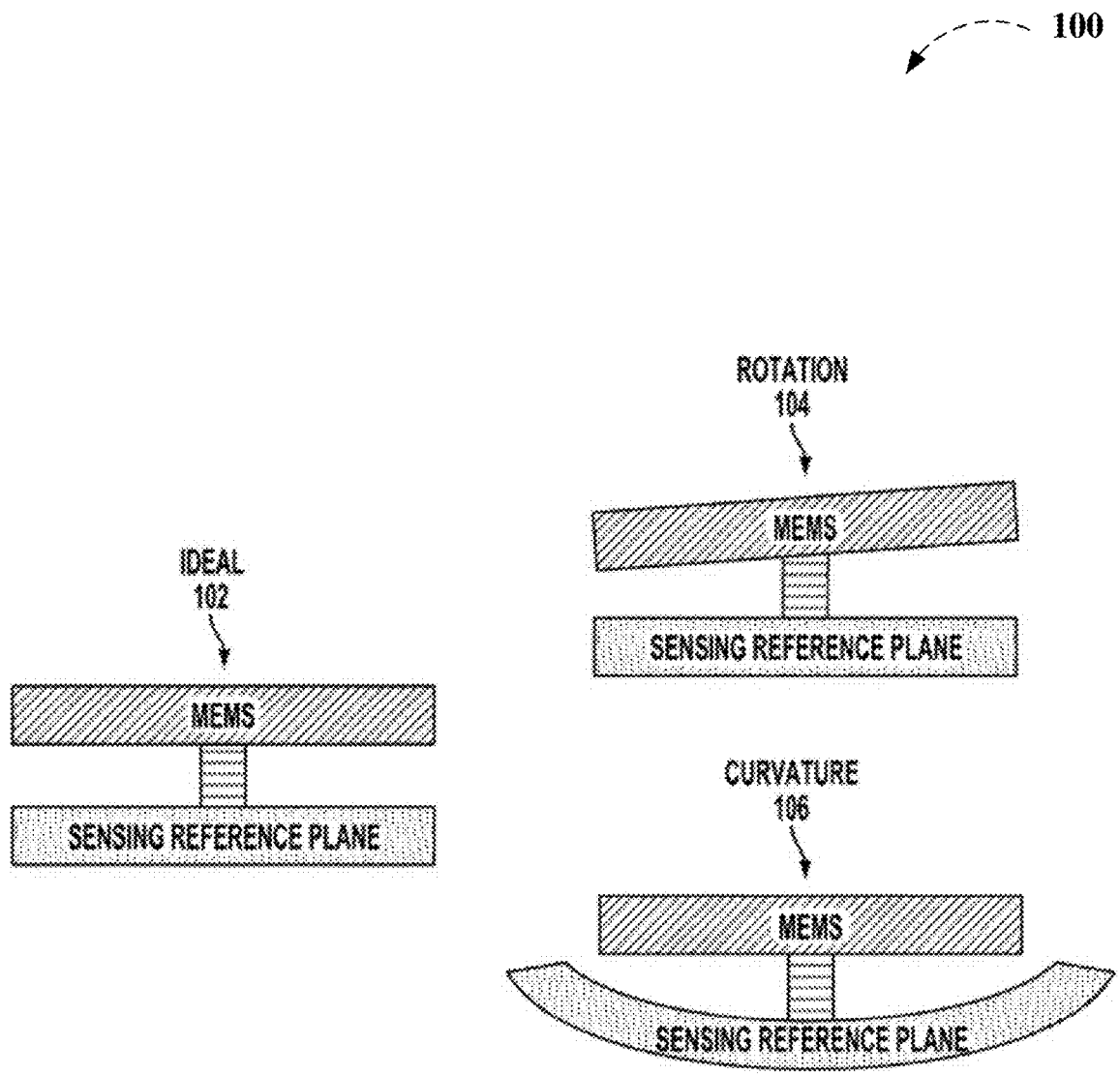
FIG. 1 illustrates a cross-sectional diagram of ideal and non-ideal MEMS sensor conditions in accordance with an embodiment.

FIG. 1 illustrates a cross-sectional diagram 100 of ideal and non-ideal MEMS sensor conditions in accordance with an embodiment. In one embodiment, the MEMS sensor includes at least a MEMS device, a sensing reference plane, and an anchor that couples the MEMS device to the sensing reference plane. In the diagram 100, an ideal condition 102 shows parallel alignment between the MEMS device and the sensing reference plane. In the diagram 100, a first non-ideal condition 104 shows a deviation in the parallel alignment due to an undesired linear tilt of at least one surface (either the MEMS device as depicted and/or the sensing reference plane). In the diagram 100, a second non-ideal condition 106 shows a deviation in the parallel alignment due to an undesired curvature of at least one surface (either the sensing reference plane as depicted and/or the MEMS device).

A system and method in accordance with the disclosed subject matter provides a MEMS sensor with a sensing reference plane that comprises a pattern of sensing elements (electrodes) to improve offset rejection. The pattern of sensing elements can be a plurality of patterns of electrodes that reduce the offset caused from the deviation of the parallel alignment between the MEMS device and the sensing reference plane. The sensing reference plane is connected to a MEMS device via an anchor. The MEMS device includes a spring connected between the anchor and a proof mass. Each electrode of the plurality of patterns of electrodes is located on the sensing reference plane such as a CMOS substrate. In a MEMS device/CMOS substrate die configuration, the proof mass and one of the plurality of electrodes located on the CMOS substrate (or sensing reference plane) form a parallel plate capacitor.

To describe the features of the disclosed subject matter in more detail, refer now to the following description in conjunction with the accompanying Figures.

Figure 2A:
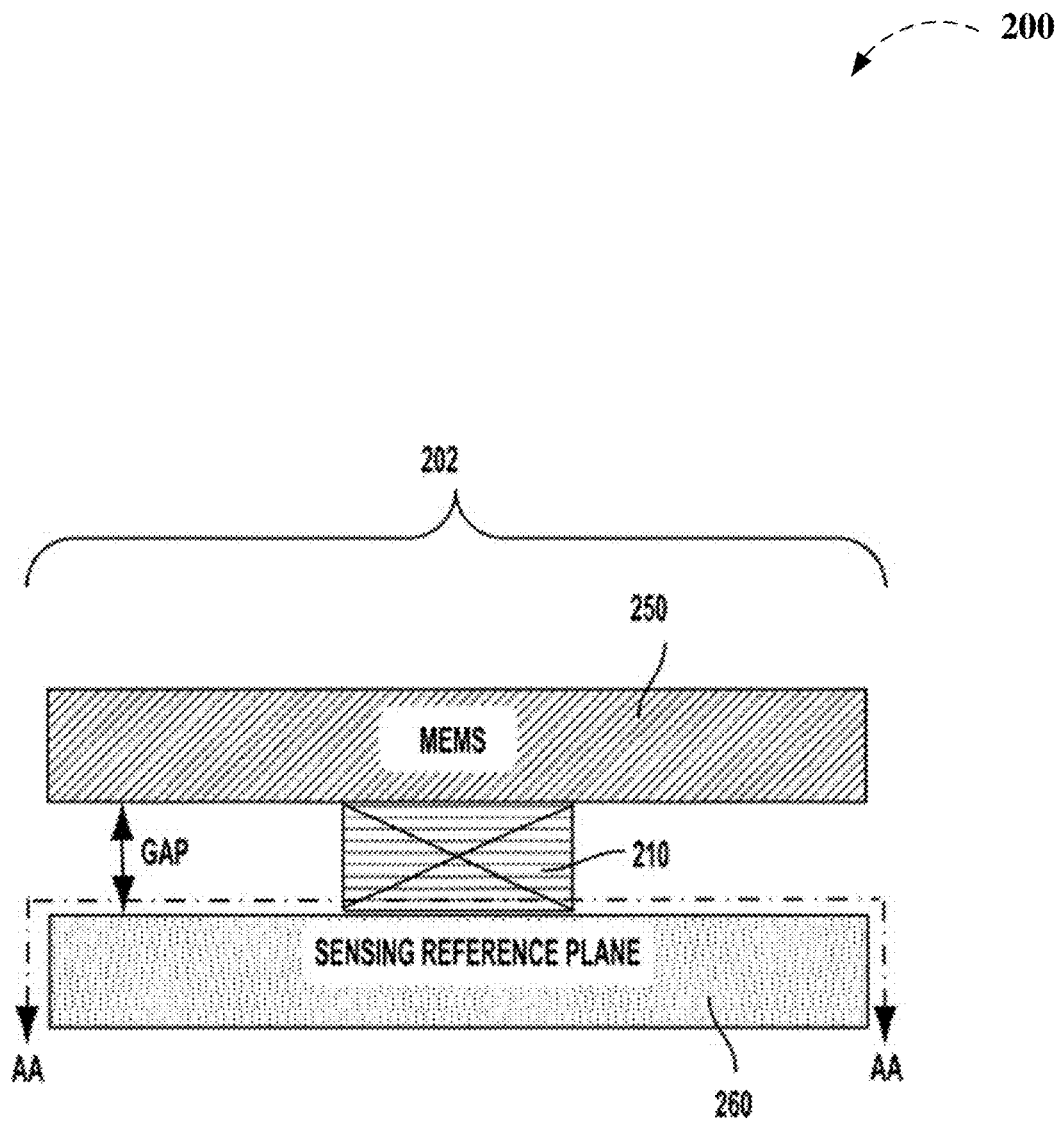
FIG. 2A illustrates a diagram with a cross-sectional view of a substrate portion of a MEMS sensor with a pattern of sensing elements in accordance with an embodiment.

FIG. 2A illustrates a diagram 200 with a cross-sectional view 202 of a substrate portion of a MEMS sensor with a pattern of sensing elements in accordance with an embodiment. The cross-sectional view 202 shows a MEMS sensor that comprises a MEMS device 250 coupled to a sensing reference plane 260 via the anchor 210 thereby creating a gap between the MEMS device 250 and the sensing reference plane 260. In the cross-sectional view 202, AA depicts the height of the sensing reference plane 260. In one embodiment, the MEMS device 250 is any of a MEMS structure and a MEMS accelerometer.

Figure 2B:
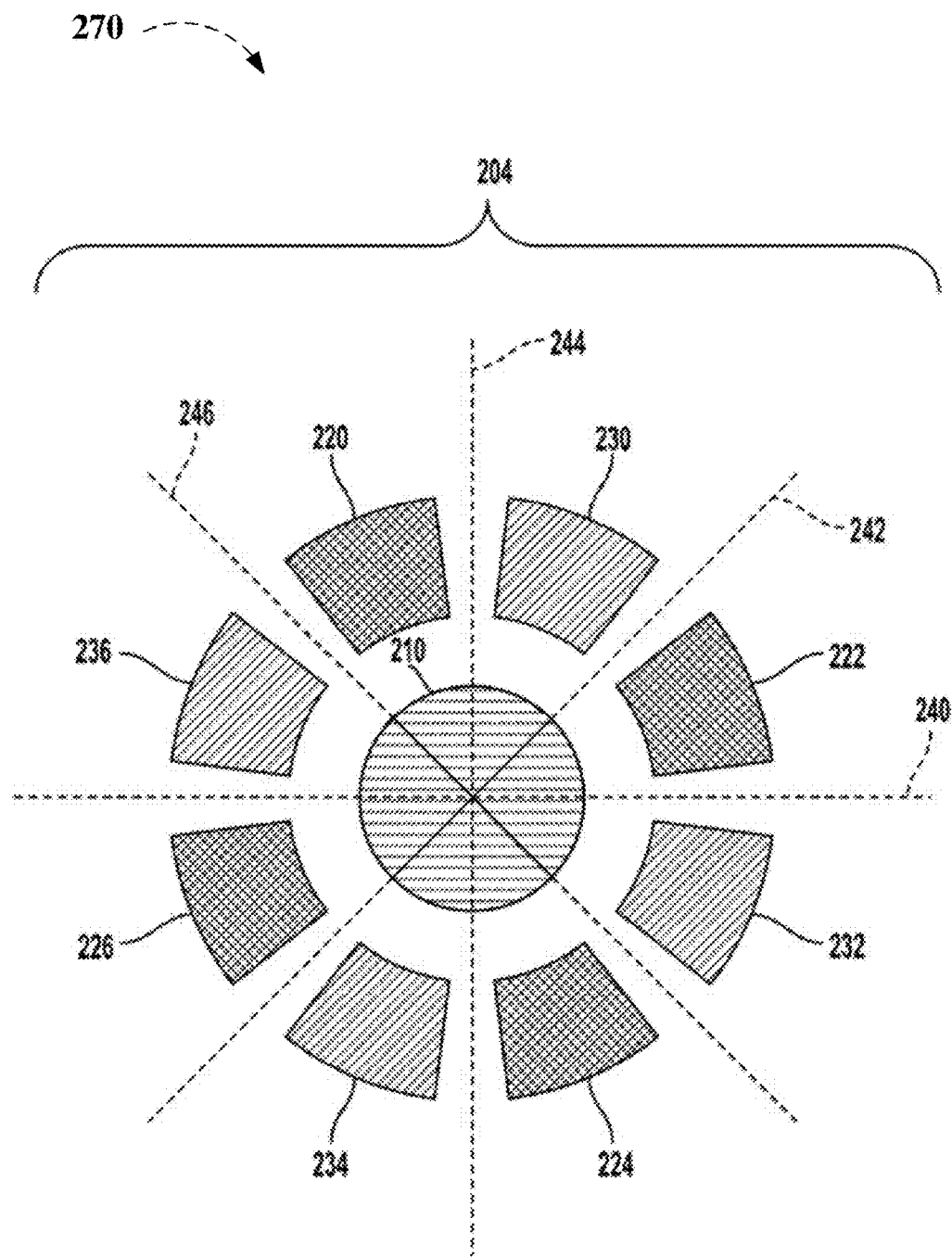
FIG. 2B illustrates a diagram with a top view of a substrate portion of a MEMS sensor with a pattern of sensing elements in accordance with an embodiment.

FIG. 2B illustrates a diagram 270 with a top view 204 of a substrate portion of a MEMS sensor with a pattern of sensing elements in accordance with an embodiment. The top view 204 shows a top view of AA which results in a top side of the pattern of sensing elements that comprise positive and negative electrodes. The top view 204 includes the anchor 210 of the MEMS sensor, positive electrodes 220, 222, 224, and 226, negative electrodes 230, 232, 234, and 236, and four axes of polarity anti-symmetry 240, 242, 244, and 246 denoted by the dashed lines. In FIG. 2A and FIG. 2B, the shape of the anchor 210 is circular to correspond to the shape of the pattern of sensing elements which is also circular.

In one embodiment, the MEMS device 250 comprises a spring connected between the anchor 210 and a proof mass. The proof mass moves in the z axis to an external force that includes but is not limited to acceleration, magnetic, Coriolis, pressure, and many others. The pattern of sensing elements comprise alternating positive and negative electrodes 220-226 and 230-236 and are connected between the MEMS device 250 and the sensing reference plane 260. The positive electrode sensing elements 220-226 detect positive movements and the negative electrode sensing elements 230-236 detect negative movements. In one embodiment, the shape of the electrode sensing elements 220-226 and 230-236 are annular sectors.

Figure 2C:
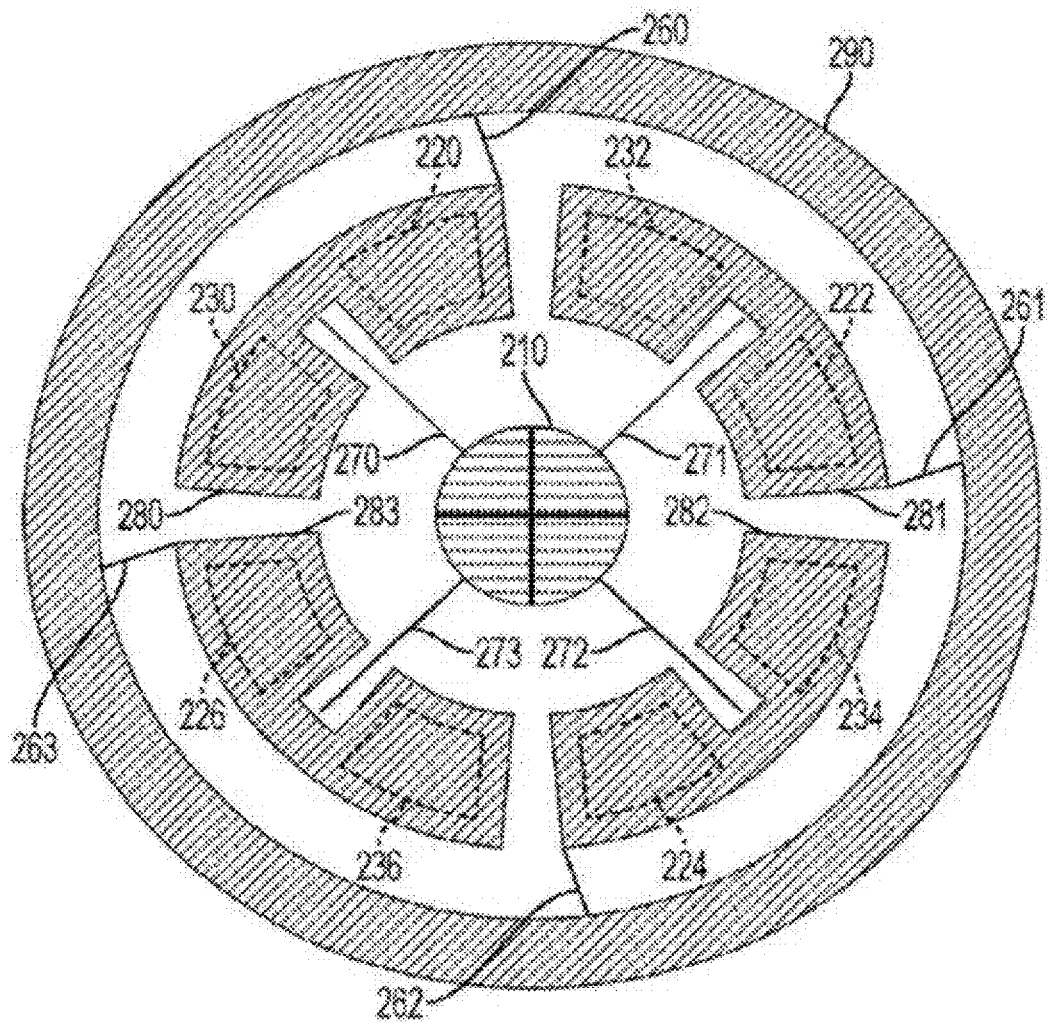
FIG. 2C illustrates a MEMS device of the MEMS sensor in accordance with an embodiment.

FIG. 2C illustrates a MEMS device of the MEMS sensor in accordance with an embodiment. In FIG. 2C, the MEMS device resembles the MEMS device 250 of FIG. 2A and is a MEMS Z axis accelerometer. In one embodiment, the MEMS device 250 further comprises, a first set of springs (260-263) and a second set of springs (270-273), sense masses 280-283, and a proof mass 290. The sense masses 280-283 are connected to the anchor 210 via the second set of springs 270-273 respectively. The sense masses 280-283 are connected to the proof mass 290 via the first set of springs 260-263 respectively. The sense masses 280-283 are detected by the positive electrodes 220, 222, 224, 226 respectively and by the negative electrodes 230, 232, 234, 236 respectively.

In one embodiment, the MEMS device 250 under positive (+) Z axis out-of-plane acceleration causes the proof mass 290 to move in a negative (−) z axis direction. The deflected proof mass 290 pushes on the first set of springs 260-263 thereby rotating the sense masses 280-283 about the second set of springs 270-273 respectively. This causes the gap between the positive electrodes 220, 222, 224 and 226 and each of the sense masses 280-283 to decrease and also causes the gap between the negative electrodes 230, 232, 234 and 236 and the sense masses 280-283 to increase.

In one embodiment, the MEMS device 250 under non-ideal conditions would behave like a flat plate like described by MEMS devices 104 and 106. The electrode pattern 204 has the properties of sensing the deflection of the MEMS device 250 under Z-axis acceleration but also rejecting non-ideal motion of MEMS device 250 described by MEMS device 104 and 106 in FIG. 1.

In this embodiment, the electrode sensing elements 220-226 and 230-236 form a differential sensing scheme. For example, the differential sensing scheme enables a gap to decrease above sensing elements 220, 222, 224, and 226 and to increase above sensing elements 230, 232, 234, and 236. Thus, motion is only detected if the gap between each pair of the positive electrode sensing elements 220-226 and the negative electrode sensing elements 230-236 and the MEMS device 250 changes due to movement by the proof mass. Therefore, the proof mass moves in a path that causes detectable motion using the differential scheme of the pattern of sensing elements (electrodes). The center of each of the sensing elements 220-226 and 230-236 has a common distance from the center of the anchor 210. As aforementioned, the sensing elements 220-226 and 230-236 have four axes of polarity anti-symmetry 240-246. In another embodiment, the pattern of sensing elements is designed with three or more axes of symmetry.

In the top view 204 of FIG. 2B, each of the positive sensing elements (electrodes) 220-226 has the same distance from anchor center to electrode center as the corresponding negative sensing elements (electrodes) 230-236. Thus, any movement that is the same on both sides of this axis would result in an equal gap shift of the positive and negative electrodes because when a positive and a negative electrode move together, no net output is generated.

Therefore, perpendicular to axis 240, the negative sensing element 236 has the same distance as the positive sensing element 222 (so electrode 236 corresponds with electrode 222 perpendicular to axis 240), the negative sensing element 230 has the same distance as the positive sensing element 220 (so electrode 230 corresponds with electrode 220 perpendicular to axis 240), the negative sensing element 232 has the same radius as the positive sensing element 226 (so electrode 232 corresponds with electrode 226 perpendicular to axis 240), and the negative sensing element 234 has the same distance as the positive sensing element 224 (so electrode 234 corresponds with electrode 224 perpendicular to axis 240). Any motion, rotation, curvature or any combination thereof, that is centered perpendicular to axis 240 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 242. In other words, each corresponding positive and negative electrode has the same distance from any point to the axis 242. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 242, the negative sensing element 230 has the same distance as the positive sensing element 226 (so electrode 230 corresponds with electrode 226 perpendicular to axis 242), the negative sensing element 236 has the same distance as the positive sensing element 220 (so electrode 236 corresponds with electrode 220 perpendicular to axis 242), the negative sensing element 232 has the same distance as the positive sensing element 224 (so electrode 232 corresponds with electrode 224 perpendicular to axis 242), and the negative sensing element 234 has the same distance as the positive sensing element 222 (so electrode 234 corresponds with electrode 222 perpendicular to axis 242). Any motion, rotation, curvature or any combination thereof, that is centered about axis 242 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 244. In other words, each corresponding positive and negative electrode has the same distance from any point to the axis 244. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 244, the negative sensing element 230 has the same distance as the positive sensing element 224 (so electrode 230 corresponds with electrode 224 perpendicular to axis 244), the negative sensing element 236 has the same distance as the positive sensing element 226 (so electrode 236 corresponds with electrode 226 perpendicular to axis 244), the negative sensing element 232 has the same distance as the positive sensing element 222 (so electrode 232 corresponds with electrode 222 perpendicular to axis 244), and the negative sensing element 234 has the same distance as the positive sensing element 220 (so electrode 234 corresponds with electrode 220 perpendicular to axis 244). Any motion, rotation, curvature or any combination thereof, that is centered about axis 244 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 246. In other words, each corresponding positive and negative electrode has the same distance from any point to the axis 246. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 246, the negative sensing element 230 has the same distance as the positive sensing element 222 (so electrode 230 corresponds with electrode 222 perpendicular to axis 246), the negative sensing element 236 has the same distance as the positive sensing element 224 (so electrode 236 corresponds with electrode 224 perpendicular to axis 246), the negative sensing element 232 has the same distance as the positive sensing element 220 (so electrode 232 corresponds with electrode 220 perpendicular to axis 246), and the negative sensing element 234 has the same distance as the positive sensing element 226 (so electrode 234 corresponds with electrode 226 perpendicular to axis 246). Any motion, rotation, curvature or any combination thereof, that is centered about axis 246 results in the positive sensing elements 220-226 moving in a similar fashion to the negative sensing element 230-236 thereby producing no net output and a zero offset with the differential sensing scheme.

Figure 3A:
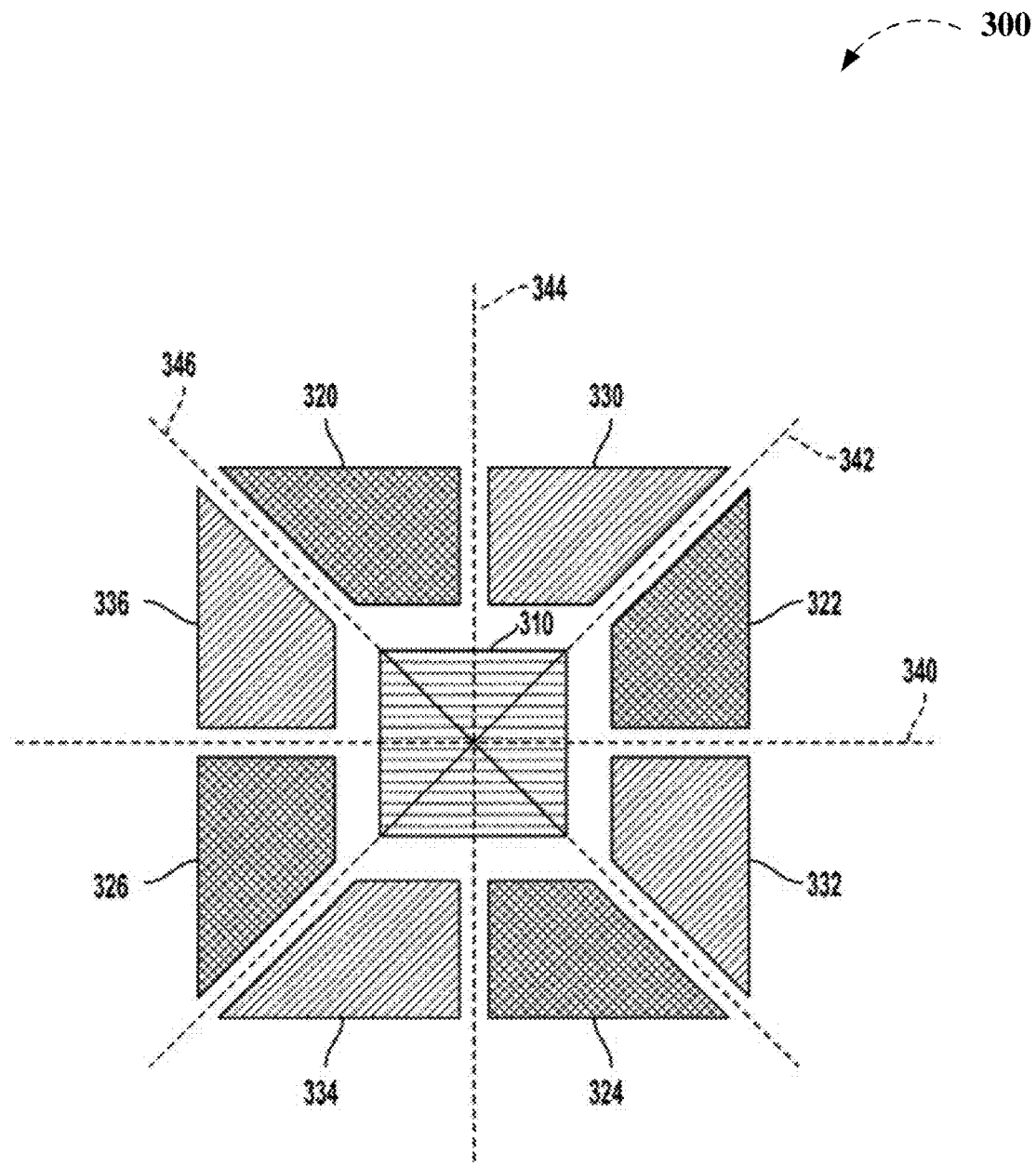
FIG. 3A illustrates a top view of a MEMS sensor with a pattern of sensing elements and the corresponding MEMS structure in accordance with another embodiment.

FIG. 3A illustrates a top view 300 of a MEMS sensor with a pattern of sensing elements and the corresponding MEMS structure in accordance with another embodiment. The top view 300 shows a top side of the pattern of sensing elements that comprise positive and negative electrodes. The top view 300 includes the anchor 310 of the MEMS sensor, positive electrodes 320, 322, 324, and 326, negative electrodes 330, 332, 334, and 336, and four axes of polarity anti-symmetry 340, 342, 344, and 346 denoted by the dashed lines. In FIG. 3A, the shape of the anchor 310 is square to correspond to the shape of the pattern of sensing elements which is also square.

In one embodiment, the MEMS sensor of FIG. 3A comprises a MEMS device coupled to a sensing reference plane via the anchor 310 thereby creating a gap between the MEMS device and the sensing reference plane. The MEMS device comprises a spring connected between the anchor 310 and a proof mass. The proof mass moves in the z axis in response to an external force that includes but is not limited to acceleration, magnetic field, Coriolis force, or pressure. The pattern of sensing elements comprises alternating positive and negative electrodes 320-326 and 330-336 on the sensing reference plane.

In this embodiment, the sensing elements 320-326 and 330-336 form a differential sensing scheme. Thus, motion is only detected if the gap between each pair of the positive electrode sensing elements 320-326 and the negative electrode sensing elements 330-336 and the MEMS device changes due to movement by the proof mass. When sensing acceleration, the proof mass moves in the same direction and in the same amount for each electrode pair (e.g., for positive sensing electrode 320 and negative sensing electrode 330). Therefore, the proof mass moves in a shape that causes detectable motion using the differential scheme of the pattern of sensing elements (electrodes). The center of each of the sensing elements 320-326 and 330-336 has a common distance from the center of the anchor 310. As aforementioned, the sensing elements 320-326 and 330-336 have four axes of anti-polarity symmetry 340-346. In another embodiment, the pattern of sensing elements is designed with three or less and five or more axes of symmetry.

In the top view 300 of FIG. 3A, each of the positive sensing elements (electrodes) 320-326 has the same distance as the corresponding negative sensing elements (electrodes) 330-336 perpendicular to axis 340. In other words, each corresponding positive and negative electrode has the same distance from any point to the axis 340. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 340, the negative sensing element 336 has the same distance as the positive sensing element 326 (so electrode 336 corresponds with electrode 326 perpendicular to axis 340), the negative sensing element 330 has the same distance as the positive sensing element 324 (so electrode 330 corresponds with electrode 324 perpendicular to axis 340), the negative sensing element 332 has the same distance as the positive sensing element 322 (so electrode 332 corresponds with electrode 322 perpendicular to axis 340), and the negative sensing element 334 has the same distance as the positive sensing element 320 (so electrode 334 corresponds with electrode 320 perpendicular to axis 3440). Any anchor rotation, curvature or any combination thereof, that is centered perpendicular to axis 340 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 342. In other words, each corresponding positive and negative electrode has the same distance from any point to the axis 342. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 342, the negative sensing element 330 has the same distance as the positive sensing element 326 (so electrode 330 corresponds with electrode 326 perpendicular to axis 342), the negative sensing element 336 has the same distance as the positive sensing element 320 (so electrode 336 corresponds with electrode 320 perpendicular to axis 342), the negative sensing element 332 has the same distance as the positive sensing element 324 (so electrode 332 corresponds with electrode 324 perpendicular to axis 342), and the negative sensing element 334 has the same distance as the positive sensing element 322 (so electrode 334 corresponds with electrode 322 perpendicular to axis 342). Any motion, rotation, curvature or any combination thereof, that is centered about axis 342 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 344. In other words, each corresponding positive and negative electrode has the same distance from any point to the axis 344. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 344, the negative sensing element 330 has the same distance as the positive sensing element 324 (so electrode 330 corresponds with electrode 320 perpendicular to axis 344), the negative sensing element 336 has the same distance as the positive sensing element 326 (so electrode 336 corresponds with electrode 326 perpendicular to axis 344), the negative sensing element 332 has the same distance as the positive sensing element 322 (so electrode 332 corresponds with electrode 322 perpendicular to axis 344), and the negative sensing element 334 has the same distance as the positive sensing element 320 (so electrode 334 corresponds with electrode 320 perpendicular to axis 344). Any motion, rotation, curvature or any combination thereof, that is centered about axis 344 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 346. In other words, each corresponding positive and negative electrode has the same distance from any point to the axis 346. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 346, the negative sensing element 330 has the same distance as the positive sensing element 322 (so electrode 330 corresponds with electrode 322 perpendicular to axis 346), the negative sensing element 336 has the same distance as the positive sensing element 324 (so electrode 336 corresponds with electrode 324 perpendicular to axis 346), the negative sensing element 332 has the same distance as the positive sensing element 320 (so electrode 332 corresponds with electrode 320 perpendicular to axis 346), and the negative sensing element 334 has the same distance as the positive sensing element 326 (so electrode 334 corresponds with electrode 326 perpendicular to axis 346). Any motion, rotation, curvature or any combination thereof, that is centered about axis 346 results in the positive sensing elements 320-326 moving in a similar fashion to the negative sensing element 330-336 thereby producing no net output and a zero offset with the differential sensing scheme.

Figure 3B:
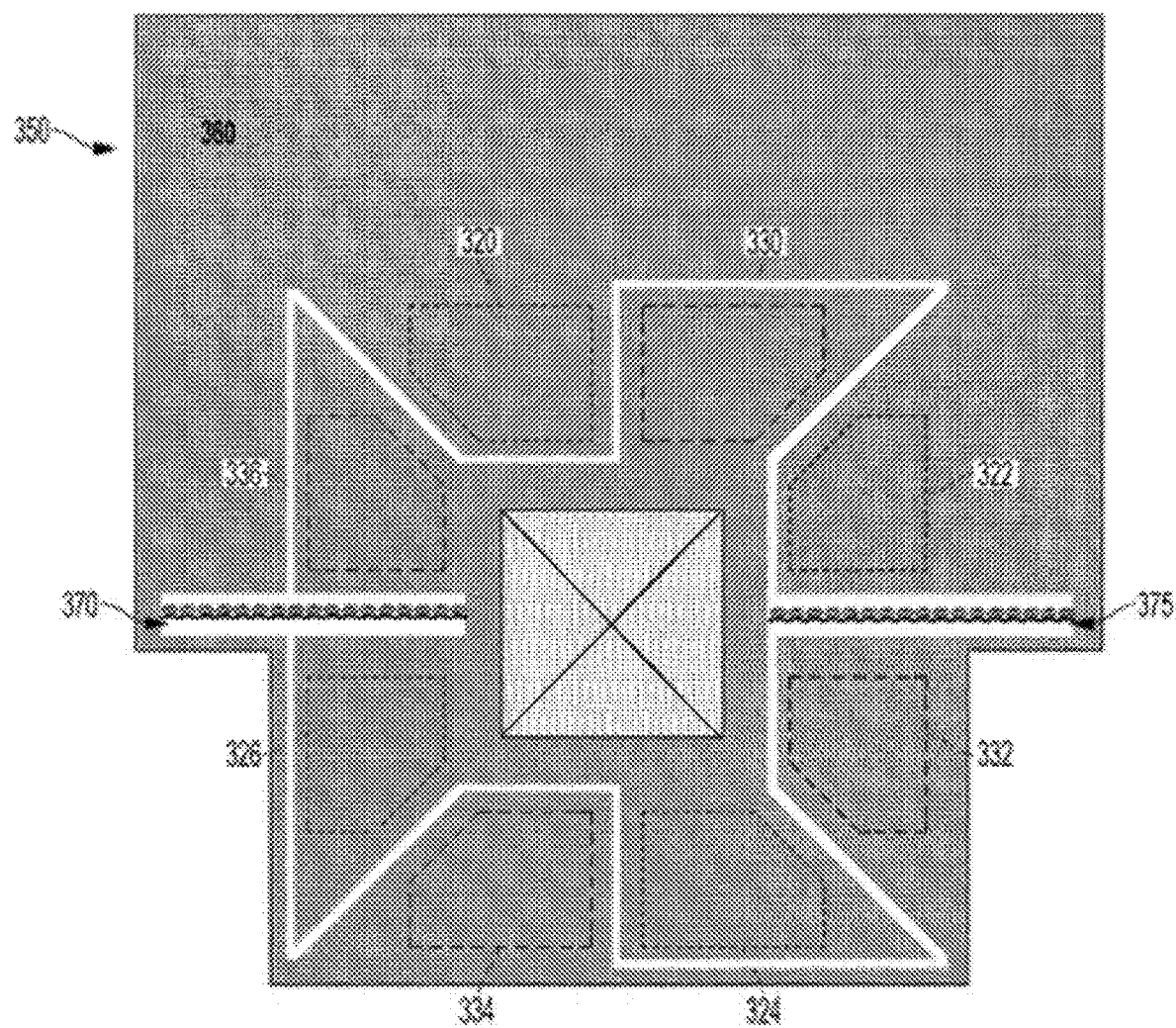
FIG. 3B illustrates a MEMS accelerometer structure of a MEMS sensor that uses an electrode pattern in accordance with an embodiment.

FIG. 3B illustrates a MEMS accelerometer structure 350 of a MEMS sensor that uses an electrode pattern in accordance with an embodiment. The MEMS accelerometer structure 350 resembles the MEMS device 250 in FIG. 2A. Under positive out-of-plane acceleration of the MEMS sensor, a proof mass 360 rotates about torsional springs 370 and 375 in a negative RX direction. This causes a decrease in a gap between positive sensing electrodes 320 and 322 and an increase in a gap between negative sensing electrodes 334 and 332, in reference to a sensing plane. In one embodiment, electrodes 324, 326, 330 and 336 are rigidly connected to an anchor and do not incur a gap change in response to an acceleration of the MEMS sensor. A signal processor combines electrodes 320-326 and 330-336 to output a signal proportional to the acceleration of the sensor.

In FIG. 3B, under anchor rotation of the MEMS sensor, as seen in the first non-ideal condition 104 of FIG. 1, all the electrodes 320-326 and 330-336 are connected to the anchor and move as a group similar to a flat plate as described in FIG. 3A about axes 340, 344, and 346. A signal processor combines electrodes 320-326 and 330-336 and no net output is generated if the anchor rotation or sensing reference plane curvature is centered about the axes 340-346. In this embodiment, the electrodes 320, 322, 332 and 334 are used to detect acceleration of the MEMS sensor and electrodes 320-326, 330-336 are used to reject offset caused from anchor rotation or sensing reference plane curvature.

Figure 4:
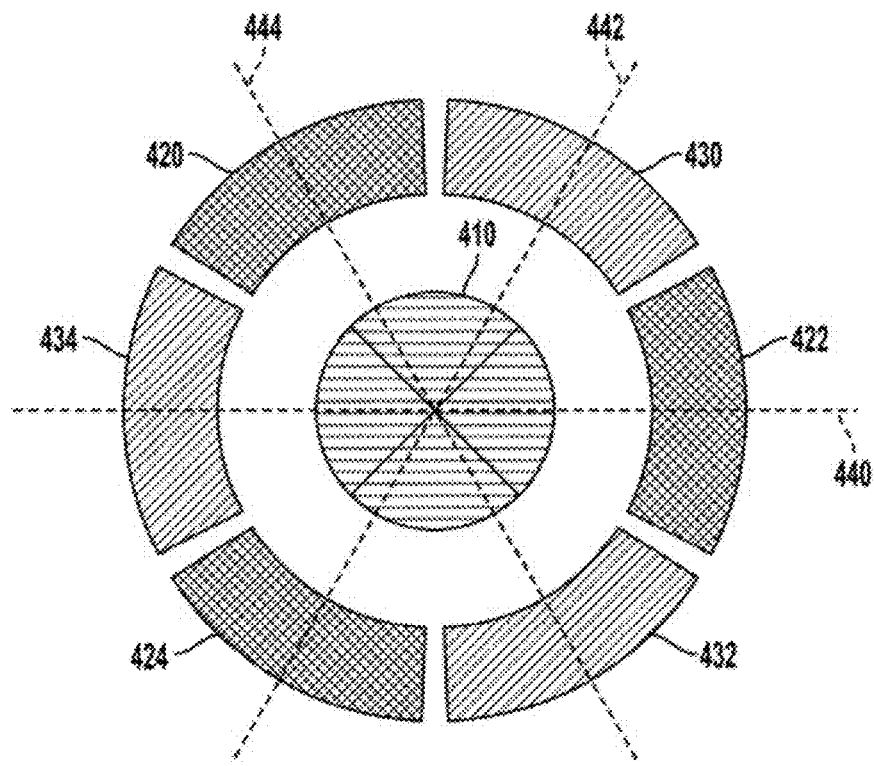
FIG. 4 illustrates a top view of a MEMS sensor with a pattern of sensing elements in accordance with another embodiment.

FIG. 4 illustrates a top view 400 of a MEMS sensor with a pattern of sensing elements in accordance with another embodiment. The top view 400 shows a top side of the pattern of sensing elements that comprise positive and negative electrodes. The top view 400 includes the anchor 410 of the MEMS sensor, positive electrodes 420, 422, and 424, negative electrodes 430, 432, and 434, and three axes of anti-polarity symmetry 440, 442, and 444 denoted by the dashed lines. In FIG. 4, the shape of the anchor 410 is circular to correspond to the shape of the pattern of sensing elements which is also circular.

In one embodiment, the MEMS sensor of FIG. 4 comprises a MEMS device coupled to a sensing reference plane via the anchor 410 thereby creating a gap between the MEMS device and the sensing reference plane. The MEMS device comprises a spring connected between the anchor 410 and a proof mass. The proof mass moves in the z axis to an external force that includes but is not limited to acceleration, magnetic field, Coriolis force, pressure, and many others. The pattern of sensing elements comprise alternating positive and negative electrodes 420-424 and 430-434 and are connected between the MEMS device and the sensing reference plane. The positive electrode sensing elements 420-424 detect positive movements and the negative electrode sensing elements 430-434 detect negative movements.

In this embodiment, the sensing elements 420-424 and 430-434 form a differential sensing scheme. Thus, motion is only detected if the positive electrode sensing elements 420-424 move relative to the negative electrode sensing elements 430-434. The proof mass moves in a shape that causes detectable motion using the differential scheme of the pattern of sensing elements (electrodes). The center of each of the sensing elements 420-424 and 430-434 has a common radius from the center of the anchor 410. As aforementioned, the sensing elements 420-424 and 430-434 have three axes of anti-polarity symmetry 440-444.

In the top view 400 of FIG. 4, each of the positive sensing elements (electrodes) 420-424 has the same distance as the corresponding negative sensing elements (electrodes) 430-434 perpendicular to axis 440. In other words, each corresponding positive and negative electrode has the same distance from any point to the axis 440. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 440, the negative sensing element 430 has the same distance as the positive sensing element 420 (so electrode 430 corresponds with electrode 420 perpendicular to axis 440), the negative sensing element 432 has the same distance as the positive sensing element 424 (so electrode 432 corresponds with electrode 424 perpendicular to axis 440) and the negative sensing element 434 has the same distance as the positive sensing element 422 (so electrode 434 corresponds with electrode 422 perpendicular to axis 440). Any motion, rotation, curvature or any combination thereof, that is centered about axis 440 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 442. In other words, each corresponding positive and negative electrode has the same distance from any point to the axis 442. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 442, the negative sensing element 434 has the same distance as the positive sensing element 420 (so electrode 434 corresponds with electrode 420 perpendicular to axis 442), the negative sensing element 432 has the same distance as the positive sensing element 422 (so electrode 432 corresponds with electrode 422 perpendicular to axis 442) and the negative sensing element 430 has the same distance as the positive sensing element 424 (so electrode 430 corresponds with electrode 424 perpendicular to axis 442). Any motion, rotation, curvature or any combination thereof, that is centered about axis 442 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 444. In other words, each corresponding positive and negative electrode has the same distance from any point to the axis 444. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 444, the negative sensing element 434 has the same distance as the positive sensing element 424 (so electrode 434 corresponds with electrode 424 perpendicular to axis 444), the negative sensing element 430 has the same distance as the positive sensing element 422 (so electrode 430 corresponds with electrode 422 perpendicular to axis 444) and the negative sensing element 432 has the same distance as the positive sensing element 420 (so electrode 432 corresponds with electrode 420 perpendicular to axis 444). Any motion, rotation, curvature or any combination thereof, that is centered about axis 444 results in the positive sensing elements 420-424 moving in a similar fashion to the negative sensing element 430-434 thereby producing no net output and a zero offset with the differential sensing scheme.

Figure 5:
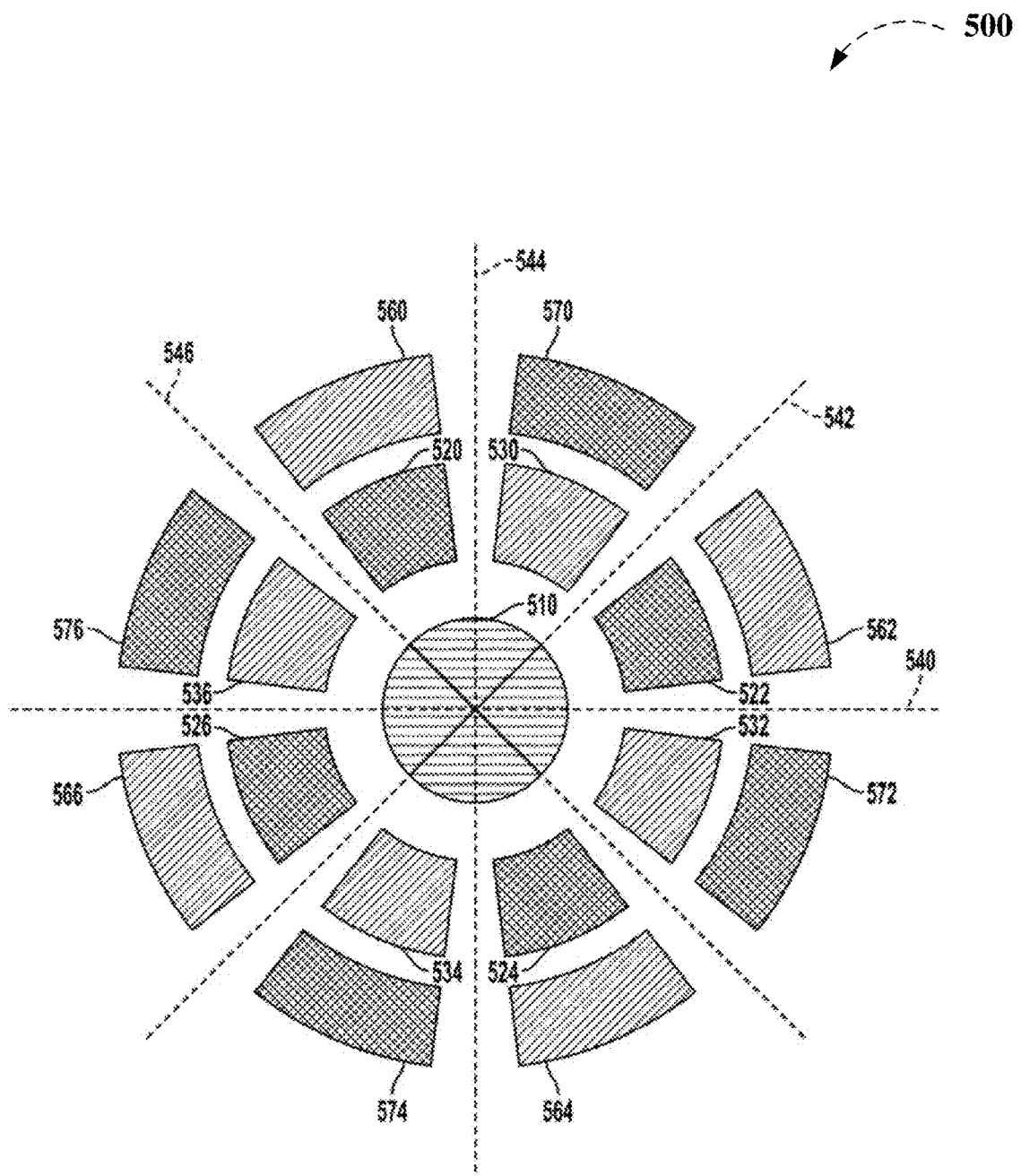
FIG. 5 illustrates a top view of a MEMS sensor with a pattern of sensing elements in accordance with another embodiment.

FIG. 5 illustrates a top view 500 of a MEMS sensor with a pattern of sensing elements in accordance with another embodiment. The top view 500 shows a top side of two independent patterns of sensing elements that comprise positive and negative electrodes. The top view 500 includes the anchor 510 of the MEMS sensor, positive electrodes 520, 522, 524, and 526 in the first pattern, negative electrodes 530, 532, 534, and 536 in the first pattern, positive electrodes 570, 572, 574, and 576 in the second pattern, negative electrodes 560, 562, 564, and 566 in the second pattern, and four axes of anti-polarity symmetry 540, 542, 544, and 546 denoted by the dashed lines. In FIG. 5, the shape of the anchor 510 is circular to correspond to the shape of the two independent patterns of sensing elements which are also circular. In another embodiment, the two patterns of sensing elements work in conjunction with each other and thus are dependent on each other.

In FIG. 5, the first pattern of sensing elements that comprises alternating positive electrodes 520-526 and negative electrodes 530-536 work in similar fashion as the pattern of sensing elements (220-226 and 230-236) in the top view 204 of FIG. 2B. Additionally, the second pattern of sensing elements that comprises alternating positive electrodes 570-576 and negative electrodes 560-566 work in similar fashion as the pattern of sensing elements (220-226 and 230-236) in the top view 204 of FIG. 2B but add an additional level of sensitivity to further reduce the offset utilizing a dual differential sensing scheme. One of ordinary skill in the art readily recognizes that the electrodes of the first and/or the second patterns of sensing elements could be reorganized and that would be within the scope of the disclosed subject matter.

Figure 6:
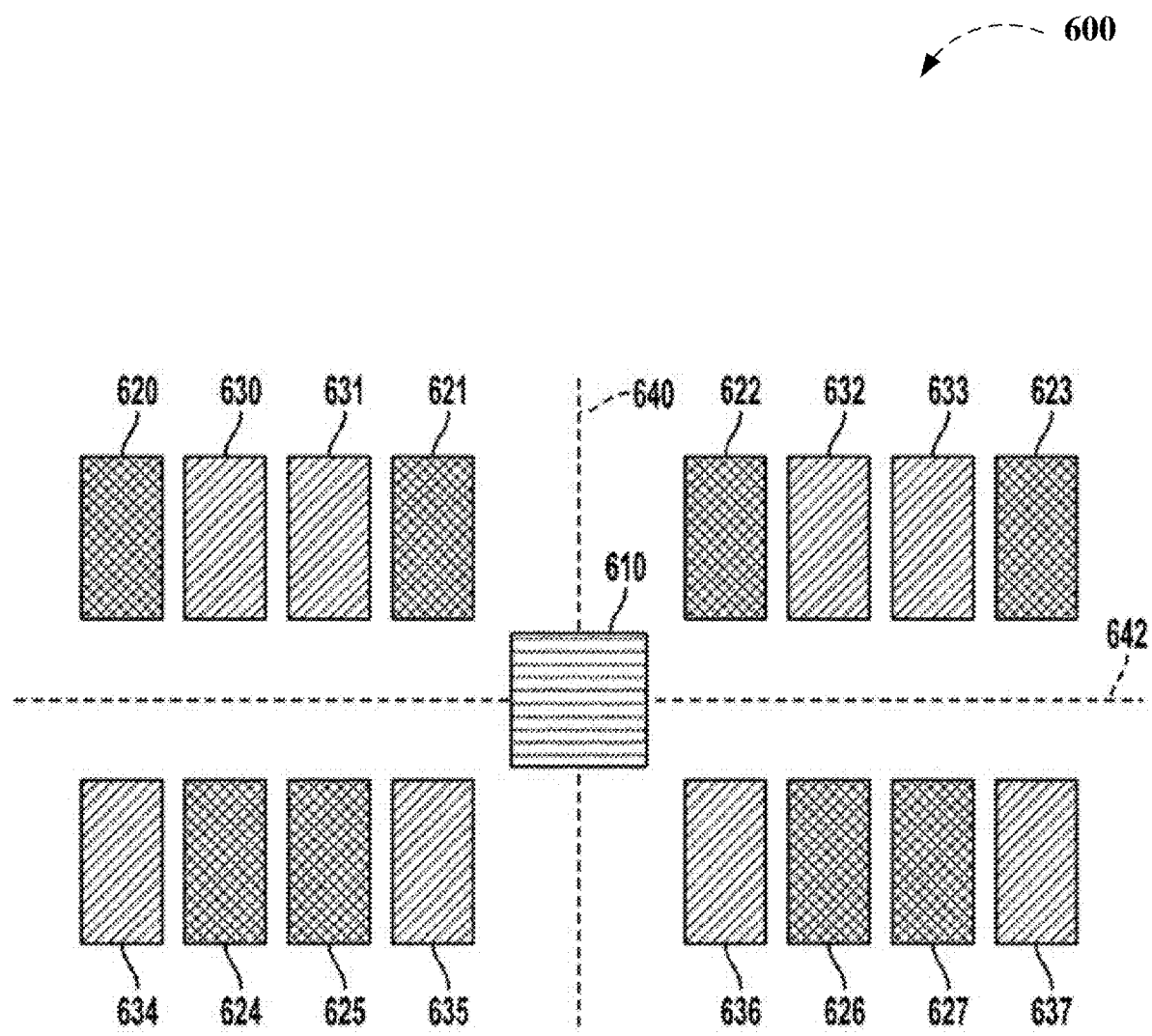
FIG. 6 illustrates a top view of a MEMS sensor with a pattern of sensing elements in accordance with another embodiment.

FIG. 6 illustrates a top view 600 of a MEMS sensor with a pattern of sensing elements in accordance with another embodiment. The top view 600 shows a top side of a pattern of sensing elements that comprise positive and negative electrodes in four quadrants that are divided by two axes 640 (y-axis) and 642 (x-axis) denoted by the dashed lines. The top view 600 includes the anchor 610 of the MEMS sensor, positive electrodes 620-621 and negative electrodes 630-631 in the first quadrant (upper left), positive electrodes 622-623 and negative electrodes 632-633 in the second quadrant (upper right), positive electrodes 624-625 and negative electrodes 634-635 in the third quadrant (lower left), and positive electrodes 626-627 and negative electrodes 636-637 in the fourth quadrant (lower right).

In FIG. 6, the positive electrodes 620-627 have a 'W' shape centered about the center of the anchor 610 and the negative electrodes 630-637 have an 'M' shape centered about the center of the anchor 610. The negative electrodes 630-637 are interwoven with the positive electrodes 620-627 to create the pattern of sensing elements that reduces the offset cause by undesirable conditions.

Due to the pattern of sensing elements of FIG. 6, any rotation that is centered about axis 642 produces no net output and a zero offset because positive electrodes 620-623 share the same distance (distance defined as the perpendicular distance between the electrode center and the axis) as negative electrodes 630-633 and positive electrodes 624-627 share the same distance as negative electrodes 634-637. Any curvature along axis 642 produces no net output and a zero offset because distance positive electrodes 620-623 share the same distance as negative electrodes 630-633 and positive electrodes 624-627 share the same distance as negative electrodes 634-637. Likewise, any curvature along axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637; and any rotation that is centered perpendicular to axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637 distance.

In one embodiment, electrodes 630 and 631 are joined into one electrode, electrodes 624 and 625 are joined into one electrode, electrodes 632 and 633 are joined into one electrode and electrodes 626 and 627 are joined into one electrode.

In a first embodiment, a MEMS sensor comprises a sensing reference plane, at least one anchor coupled to the sensing reference plane, and at least one proof mass coupled to the at least one anchor, wherein one of the at least one proof mass moves under an external excitation. The MEMS sensor further comprises a pattern of sensing elements (or sensing electrodes) that lies on the sensing reference plane or is coupled between the sensing reference plane and the at least one proof mass to detect motion of the at least one proof mass normal to the sensing reference plane, wherein the pattern of sensing elements shares at least three axes of polarity anti-symmetry. The MEMS sensor further comprises a signal processing circuit to combine the pattern of sensing elements thereby providing an output proportional to the external excitation. In one embodiment, the output is a difference between positive and negative sensing elements of the pattern of sensing elements.

In one embodiment, the at least one proof mass is coupled to the at least one anchor by at least one spring. In one embodiment, the pattern of sensing elements share any of one, two, three, four, and five or greater axes of polarity anti-symmetry. In one embodiment, a centroid of each sensing element shares a common distance to a center of the at least one anchor. In one embodiment, the pattern of sensing elements comprising sensing electrodes forming a variable capacitor between each electrode and the at least one proof mass.

In one embodiment, the pattern of sensing electrodes comprise alternating positive and negative electrodes and in another embodiment, the positive and negative electrodes are not alternating and instead can include two or more positive and/or two or more negative electrodes next to each other. In one embodiment, the pattern of sensing electrodes comprises at least three positive sensing electrodes and at least three negative sensing electrodes that are alternating.

In one embodiment, each negative sensing element/electrode has the same area as each positive sensing element/electrode and in another embodiment, each negative sensing element/electrode has substantially the same electrode area as each positive sensing element/electrode. In one embodiment, the sensing electrodes are any of capacitive sensing, piezoresistive sensing, and magnetic sensing electrodes. In one embodiment, a center of each of the sensing electrodes is on a perimeter of any of a circle, rectangle, square, hexagon, octagon, and other polygon and the sensing electrodes themselves are any of circular, rectangular, square, hexagonal, octagonal, annular sector, and polygonal in shape.

In one embodiment, the MEMS sensor further comprises a second pattern of sensing elements on the sensing reference plane to detect the motion of the at least one proof mass relative to the sensing reference plane, wherein each sensing element of the second pattern of sensing elements shares at least three axes of polarity anti-symmetry and further wherein a centroid of each sensing element of the second pattern of sensing elements shares a second common distance to the center of the at least one anchor. In another embodiment, the MEMS sensor comprises a plurality of patterns of sensing elements that are coupled either on top of each other or next to each other to further reduce the offset.

In a second embodiment, the sensing reference plane of the MEMS sensor is divided by two axes (a first and a second axis) forming four quadrants on the sensing reference plane and the pattern of sensing elements comprises at least three sensing elements in each of the four quadrants to detect motion of the at least one proof mass relative to the sensing reference plane. In this embodiment, the MEMS sensor includes at least one anchor coupled to the sensing reference plane and at least one proof mass coupled to the at least one anchor, wherein one of the at least one proof mass moves under an external excitation. Each of the four quadrants includes two outside sensing electrodes of a first polarity and two inside sensing electrodes of a second polarity. The first polarity is opposite of the second polarity and there is polarity anti-symmetry of the at least three sensing elements in each of the four quadrants.

In one embodiment, in each of the four quadrants the closest sensing element and the furthest sensing element, relative to one of the first or second axes, is of a first polarity and in between the closest sensing element and the furthest sensing element there is at least one sensing element of a second polarity. In one embodiment, the first polarity is opposite of the second polarity and there is polarity anti-symmetry of the four quadrants about at least one of the first or the second axis. In one embodiment, a center of the at least one anchor coincides with an intersection of the first and the second axis. In one embodiment, a centroid of the at least three sensing elements in each of the four quadrants shares a common distance from at least one of the first or the second axis. In one embodiment, a sensing element area is substantially the same between the first and the second polarity.

In one embodiment, the pattern of sensing elements comprises a first and a second pattern, wherein the first pattern is a M-shaped polarity pattern centered about the at least one anchor and the second pattern is a W-shaped polarity pattern centered about the at least one anchor. In one embodiment, at least a portion of the at least four sensing elements in each of the four quadrants is in a straight line and in another embodiment, at least a portion of the at least four sensing elements in each of the four quadrants is in a non-straight line and/or orientation.

The sensing elements of the at least four sensing elements that have opposite polarities share a common distance from one of the lines of symmetry. In one embodiment, the at least four sensing elements are any of circular, rectangular, square, hexagonal, octagonal, and polygonal in shape. In another embodiment, the sensing reference plane is not divided into any quadrants and the pattern of sensing elements instead comprises two sets of at least four sensing elements that are on the same axis and on opposite sides of the at least one anchor.

As above described, a system (MEMS sensor) and a method in accordance with the disclosed subject matter utilizes a plurality of patterns of sensing elements (electrodes) on a sensing reference plane to reduce the adverse effects of deviations in parallel alignment between the MEMS device of the MEMS sensor and the sensing reference plane that occur due to various undesirable forces. The deviations in parallel alignment cause offsets and each of the plurality of patterns produces no net output and improves offset rejection (provides a zero or reduced offset) by utilizing a plurality of sensing schemes that counteract the detected rotational and/or curvature type forces.

In addition, according to other described embodiments, the subject disclosure provides MEMS accelerometer structures and apparatuses configured to reduce undesired signals generated by deformations of the surfaces or substrates upon which the MEMS structure is anchored, which can improve offset stability of out-of-plane sensing MEMS accelerometers. For instance, as described above, in MEMS inertial sensors, such as in a capacitive MEMS accelerometer, offset (undesired output signal when no external acceleration is applied) is mainly generated by deformations of the substrate comprising the MEMS device. In an exemplary case of a MEMS accelerometer sensitive to an acceleration in the out-of-plane direction, the purpose of not generating any signal when a substrate deformation occurs can be addressed in multiple ways. The disclosed subject matter provides further non-limiting embodiments employing exemplary aspects of suppressing such undesired signals.

The disclosed subject matter provides planar MEMS structures which can be suspended via an anchor point, above a plane surface associated with a MEMS substrate, such as described above regarding FIGS. 2A-2B. In non-limiting aspects, exemplary MEMS structures and apparatuses can comprise a reference MEMS structure to measure anchor deformation a sensing MEMS structure, as further described below. In further non-limiting aspects, the reference MEMS structure and the sensing MEMS structure can be connected by one or more spring (e.g., sense spring), which can be collectively referred to as a flexible coupling, as further described herein. In yet another non-limiting aspect, an exemplary sensing MEMS structure as described herein can move together with an exemplary reference MEMS structure in presence of apparatus deformation, whereas the exemplary sensing MEMS structure is further subject to movement relative to the exemplary reference MEMS structure in response to an external force on the exemplary MEMS structures and apparatuses, as further described herein.

In an exemplary MEMS accelerometer as described herein, the exemplary sensing MEMS structure can be configured to generate the desired signal in response to an external acceleration along the sensing axis. In a further non-limiting embodiment of a tilting z-axis accelerometer, this further movement is a tilting motion about the axis where the sense spring or flexible coupling lies.

In further non-limiting aspects, described embodiments can be characterized by a capacitive sensing architecture, wherein a first plate of a capacitor can be configured to lie on a surface of respective MEMS planar structures, and wherein an opposing plate of the capacitor can be configured to lie on a plane surface which is parallel to a surface of the first plate (e.g., on or adjacent to MEMS substrate). Accordingly, as further described herein, electrodes on the respective MEMS planar structures can be configured for transducing external load applied to the exemplary MEMS structures and apparatuses into capacitance information, wherein electrodes on the exemplary reference MEMS structures can be configured to compensate for undesired signals that would otherwise be generated. According to various non-limiting embodiments, exemplary electrodes can be arranged in a circular fashion, as further described herein.

In described embodiments, all the electrodes can have the same area and the same radius from the anchor center, which is located in the center of the electrodes pattern, according to various non-limiting embodiments. According to still further non-limiting aspects, the center of the electrodes pattern corresponds with the center of where the exemplary reference MEMS structure is anchored.

In other exemplary embodiments, exemplary reference MEMS structures and exemplary sensing MEMS structures can have alternating interdigitated arms or annular sectors, in further non-limiting aspects. In exemplary embodiments, the number of arms or annular sectors of the exemplary reference MEMS structures and exemplary sensing MEMS structures is not the same, wherein, one of exemplary reference MEMS structures and exemplary sensing MEMS structures has at least two more, which number of arms or annular sectors of the exemplary reference MEMS structures can be independent of the number of electrodes, in still further non-limiting aspects.

According to various embodiments described herein, a minimum number of electrodes can be six but can be increased only with an increment of 4, which numbers (6, 10, 14, 18, . . . ) can allow exemplary MEMS structures or apparatuses to be completely symmetric about the axis orthogonal to sense spring or flexible coupling axis. In further non-limiting embodiments, exemplary reference MEMS structure can be symmetric about the axis where the sense springs (or flexible coupling) lie. As further described below, depending on the number of electrodes (n), the reference structure can be symmetric about up to ((n+2)/4) axes.

According to further non-limiting embodiments, exemplary sense MEMS structures, can be completely symmetric about the axis orthogonal to the spring or flexible coupling axis, and in turn can be composed by a balanced sense structure, which can be symmetric about the spring or flexible coupling axis, and an unbalanced sense structure, which can have a unique symmetry axis one orthogonal to the spring or flexible coupling axis, in still further non-limiting aspects. According to various non-limiting embodiments described herein, exemplary MEMS structures or apparatuses including the circular arrangement of the electrodes can completely reject a rigid anchor tilt along n/2 axes.

Figure 7:
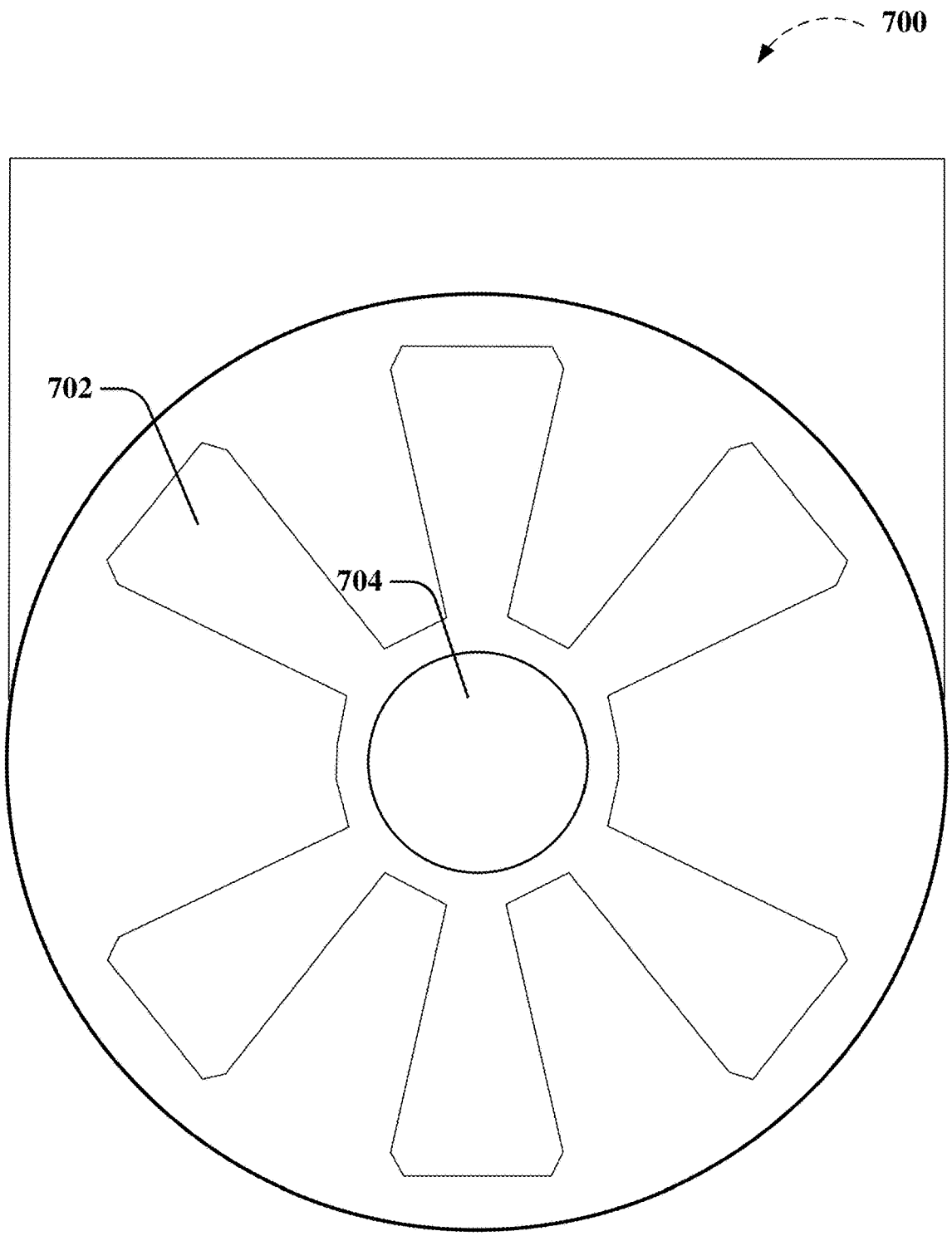
FIG. 7 depicts various aspects of another non-limiting embodiment directed to a reference MEMS structure of an exemplary MEMS apparatus as described herein.

Accordingly, FIG. 7 depicts various aspects of another non-limiting embodiment directed to a reference MEMS structure of an exemplary MEMS apparatus 700 as described herein. In non-limiting aspects, exemplary MEMS apparatus can comprise an exemplary reference MEMS structure 702, located in a plane above a MEMS substrate (not shown), such as described above regarding FIGS. 2A-2B. in another non-limiting aspect, exemplary reference MEMS structure 702 can be anchored (e.g., via anchor 704) to the MEMS substrate.

Figure 8:
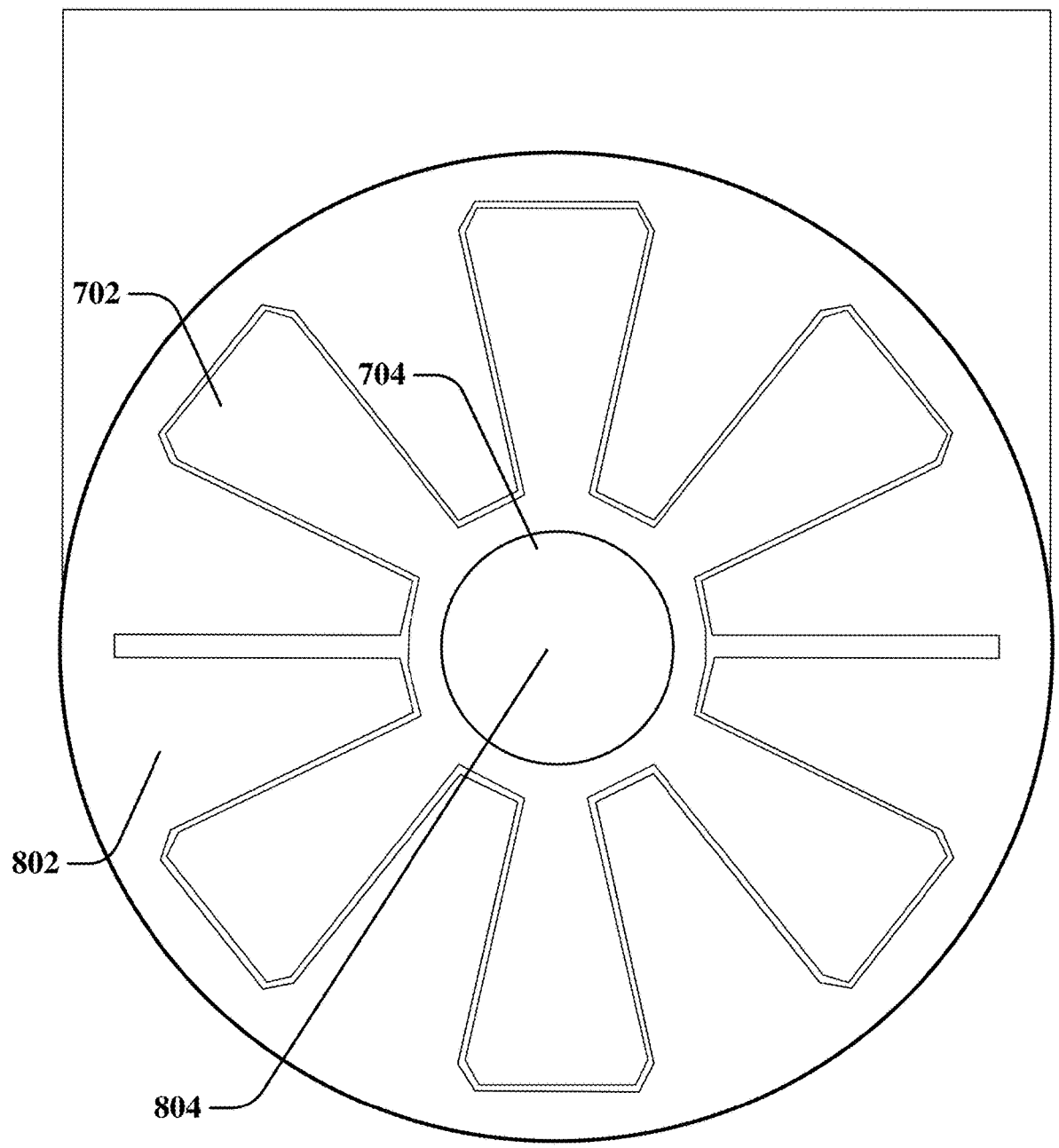
FIG. 8 depicts further non-limiting aspects directed to a sensing MEMS structure of another exemplary embodiment.

FIG. 8 depicts further non-limiting aspects directed to a sensing MEMS structure 802 of another exemplary embodiment. For instance, exemplary MEMS apparatus 700 can further comprise an exemplary sensing MEMS structure 802 that can be located substantially in the plane above the MEMS substrate (not shown), such as described above regarding FIGS. 2A-2B. In yet another non-limiting aspect, exemplary sensing MEMS structure 802 can be configured to move in response to an external load applied (e.g., an acceleration) to exemplary MEMS apparatus 700. In still further non-limiting aspects, exemplary reference MEMS structure 702 and exemplary sensing MEMS structure 802 can each be configured as respective sets of arms (e.g., sets of arms of reference MEMS structure 702 and of sensing MEMS structure 802) arranged as an interdigitated set of arms (e.g., alternating arrangement of sets of arms of reference MEMS structure 702 and of sensing MEMS structure 802) extending radially around a center 804 of the reference MEMS structure 702, for example, as further described, regarding FIG. 9. In another non-limiting aspect of exemplary MEMS apparatus 700, the sensing MEMS structure 802 comprises a balanced sense mass and an unbalanced sense mass, for example, as further described below regarding FIG. 15.

Figure 9:
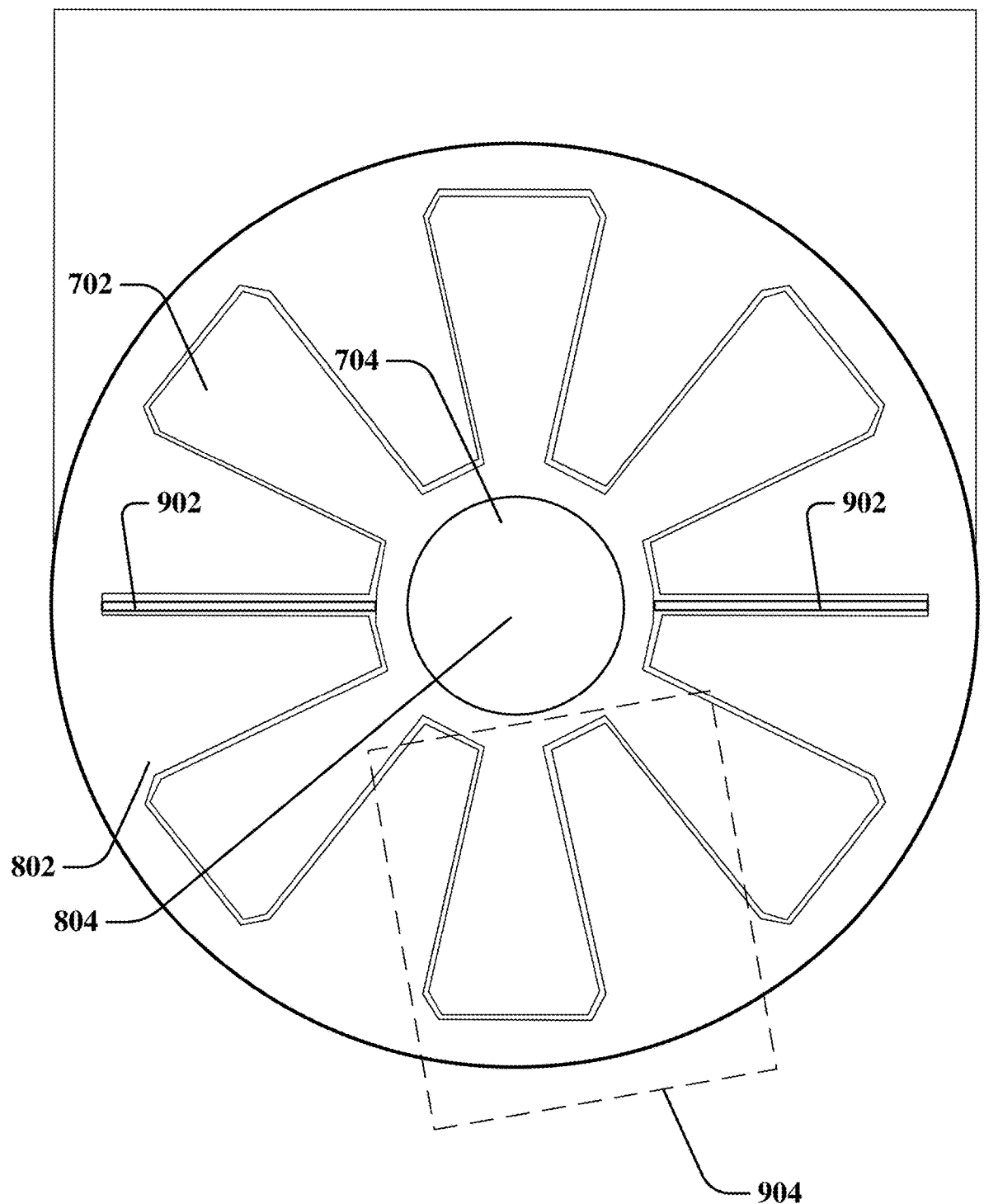
FIG. 9 depicts still further non-limiting aspects directed to an exemplary flexible coupling according to an exemplary embodiment as described herein.

FIG. 9 depicts still further non-limiting aspects directed to an exemplary flexible coupling 902 according to an exemplary embodiment as described herein. For instance, exemplary MEMS apparatus 700 can further comprise a flexible coupling 902 configured to suspend the sensing MEMS structure 802 above the MEMS substrate (not shown), such as described above regarding FIGS. 2A-2B. FIG. 9 further highlights a portion of an exemplary interdigitated set of arms 904 (e.g., alternating arrangement of sets of arms of reference MEMS structure 702 and of sensing MEMS structure 802) extending radially around the center 804 of the reference MEMS structure 702.

FIG. 9 depicts another non-limiting aspect of exemplary MEMS apparatus 700, wherein the interdigitated set of arms 904 (e.g., alternating arrangement of sets of arms of reference MEMS structure 702 and of sensing MEMS structure 802) can be configured in a circular arrangement around the center 804 of the reference MEMS structure 702. In yet another non-limiting aspect of exemplary MEMS apparatus 700, a quantity of the interdigitated set of arms 904 associated with the reference MEMS structure 702 can be different than a quantity of the interdigitated set of arms 904 associated with the sensing MEMS structure 802. For example, the quantity of the interdigitated set of arms 904 associated with the reference MEMS structure 702 can be different than the quantity of the interdigitated set of arms 904 associated with the sensing MEMS structure 802 by two interdigitated arms, according to still further non-limiting aspects. In still further non-limiting aspects of MEMS apparatus 700, the flexible coupling 902 can be oriented substantially along a first axis of symmetry of the reference MEMS structure 702 that substantially intersects the center 804 of the reference MEMS structure 702 substantially in the plane above the MEMS substrate, such as described above regarding FIGS. 2A-2B, and as further described below regarding FIG. 14.

Figure 10:
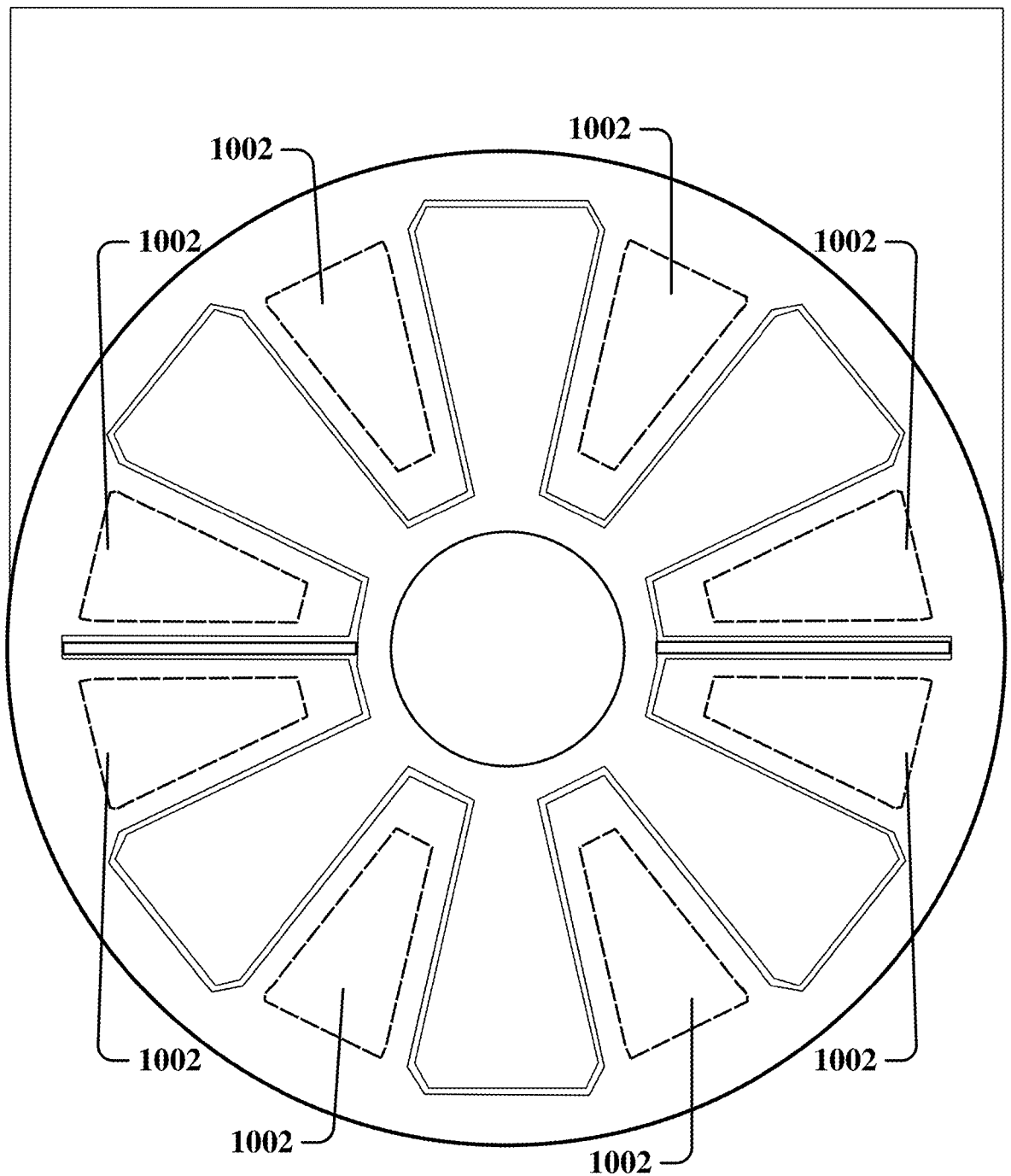
FIG. 10 depicts various aspects of a non-limiting embodiment directed to sense electrodes of an exemplary apparatus as described herein.

FIG. 10 depicts various aspects of a non-limiting embodiment directed to sense electrodes of an exemplary apparatus as described herein. For instance, exemplary MEMS apparatus 700 can further comprise, a plurality of sense electrodes 1002 that can be located parallel to the sensing MEMS structure 802 (e.g., lying on a surface of respective MEMS planar structures) and that can be configured to sense position of the sensing MEMS structure 802, as further described herein.

Figure 11:
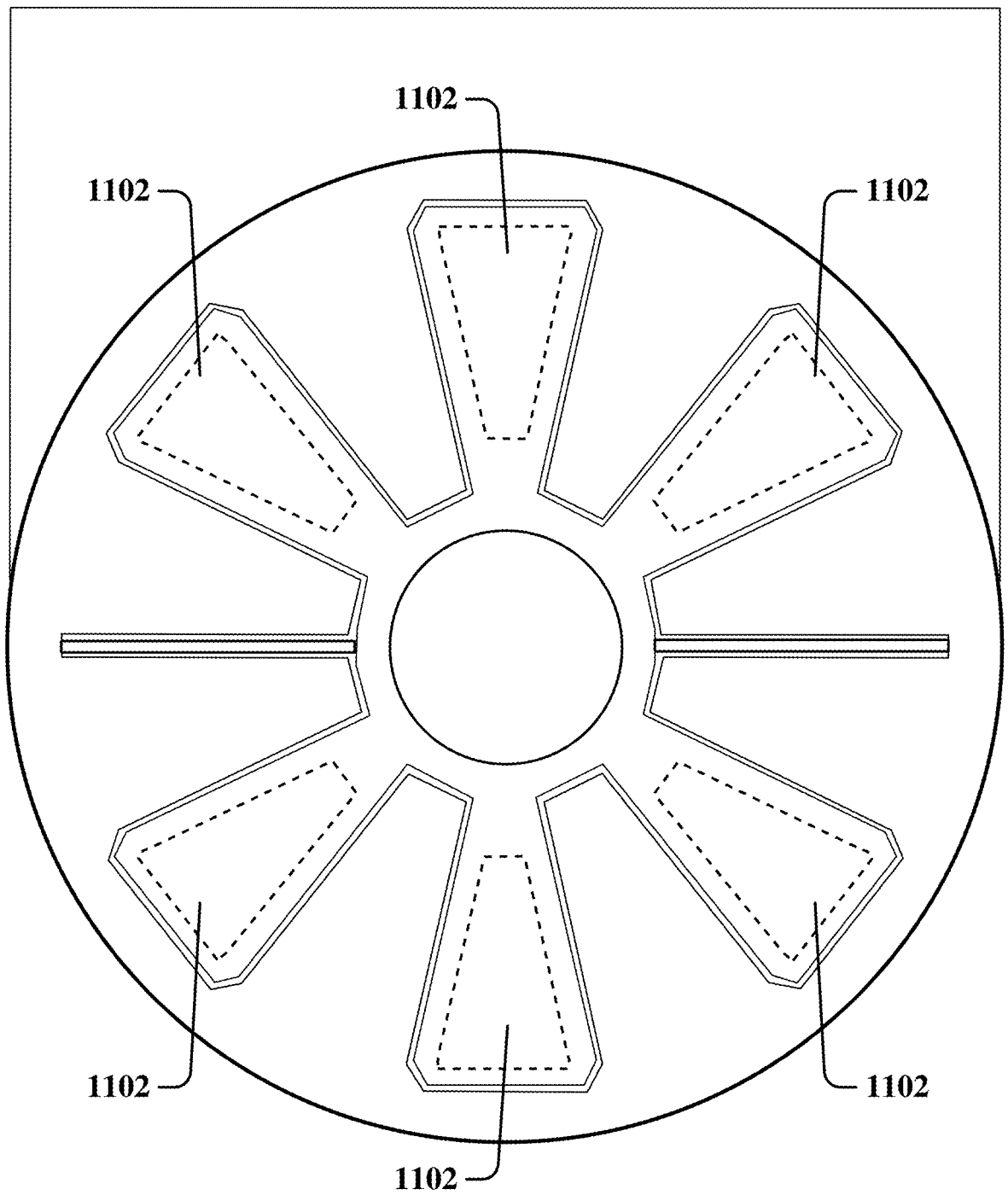
FIG. 11 shows further aspects of a non-limiting embodiment directed to reference electrodes of an exemplary apparatus.

FIG. 11 shows further aspects of a non-limiting embodiment directed to reference electrodes of an exemplary apparatus. For instance, exemplary MEMS apparatus 700 can further comprise, a plurality of reference electrodes 1102 that can be located parallel to the reference MEMS structure 702 (e.g., lying on a surface of respective MEMS planar structures), and that can be configured to sense deformation of the MEMS substrate, MEMS substrate (not shown), such as described above regarding FIGS. 1, 2A-2B, etc.

Figure 12:
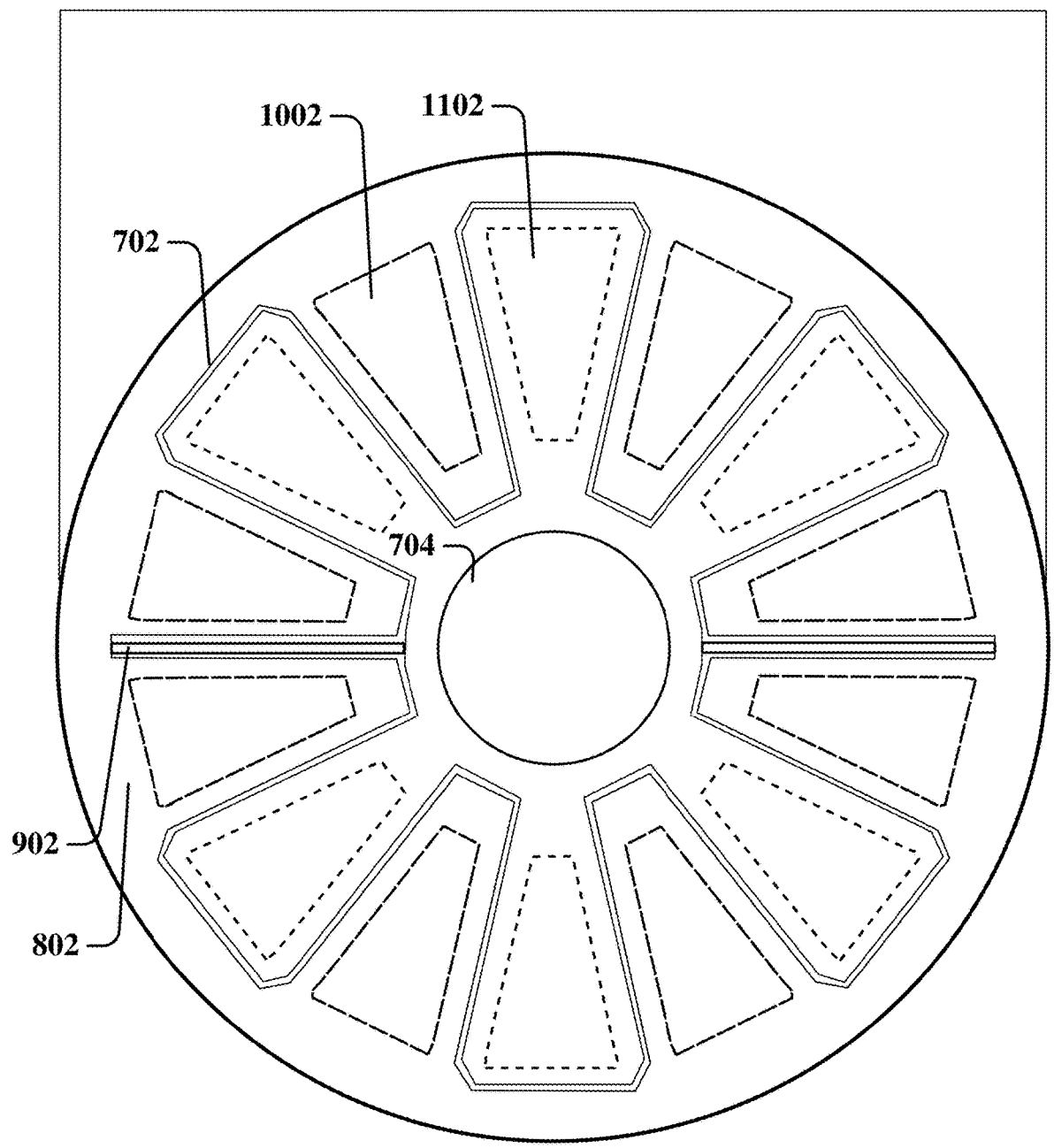
FIG. 12 depicts further non-limiting aspects of an exemplary apparatus as described herein.

FIG. 12 depicts further non-limiting aspects of an exemplary apparatus as described herein. For instance, as described above, FIG. 9 further highlights a portion of an exemplary interdigitated set of arms 904 (e.g., alternating arrangement of sets of arms of reference MEMS structure 702 and of sensing MEMS structure 802) extending radially around the center 804 of the reference MEMS structure 702. In another non-limiting aspect of exemplary MEMS apparatus 700, each of the plurality of the reference electrodes 1102 and each of the plurality of the sense electrodes 1002 can be associated with a respective arm (e.g., one arm of the sets of arms of reference MEMS structure 702 or of sensing MEMS structure 802) within the interdigitated set of arms 904 (e.g., alternating arrangement of sets of arms of reference MEMS structure 702 and of sensing MEMS structure 802). As depicted in FIG. 12, each of the sense electrodes 1002 is associated with a respective arm or annular sector of the sensing MEMS structure 802, whereas each of the reference electrodes 1102 is associated with a respective arm or annular sector of the sensing reference structure 702.

In yet another non-limiting aspect of exemplary MEMS apparatus 700, a quantity of the plurality of the reference electrodes 1102 can be different than a quantity of the plurality of the sense electrodes 1002. In a non-limiting example, in another non-limiting aspect of MEMS apparatus 700, a sum of the plurality of the reference electrodes 1102 and the plurality of the sense electrodes 1002 can be at least six. In yet another non-limiting example, the sum is defined by a number of electrodes, n, where n equals 6+4x, and where x is equal to a selection of zero or a positive integer (e.g., 6, 10, 14, 18, . . . ).

According to still further non-limiting aspects of exemplary MEMS apparatus 700, one or more of the sense electrodes 1002 and the reference electrodes 1102 can be located beneath the plane above the MEMS substrate, such as described above regarding FIGS. 2A-2B as indicated in FIG. 12, by dashed lines showing hidden.

Figure 13:
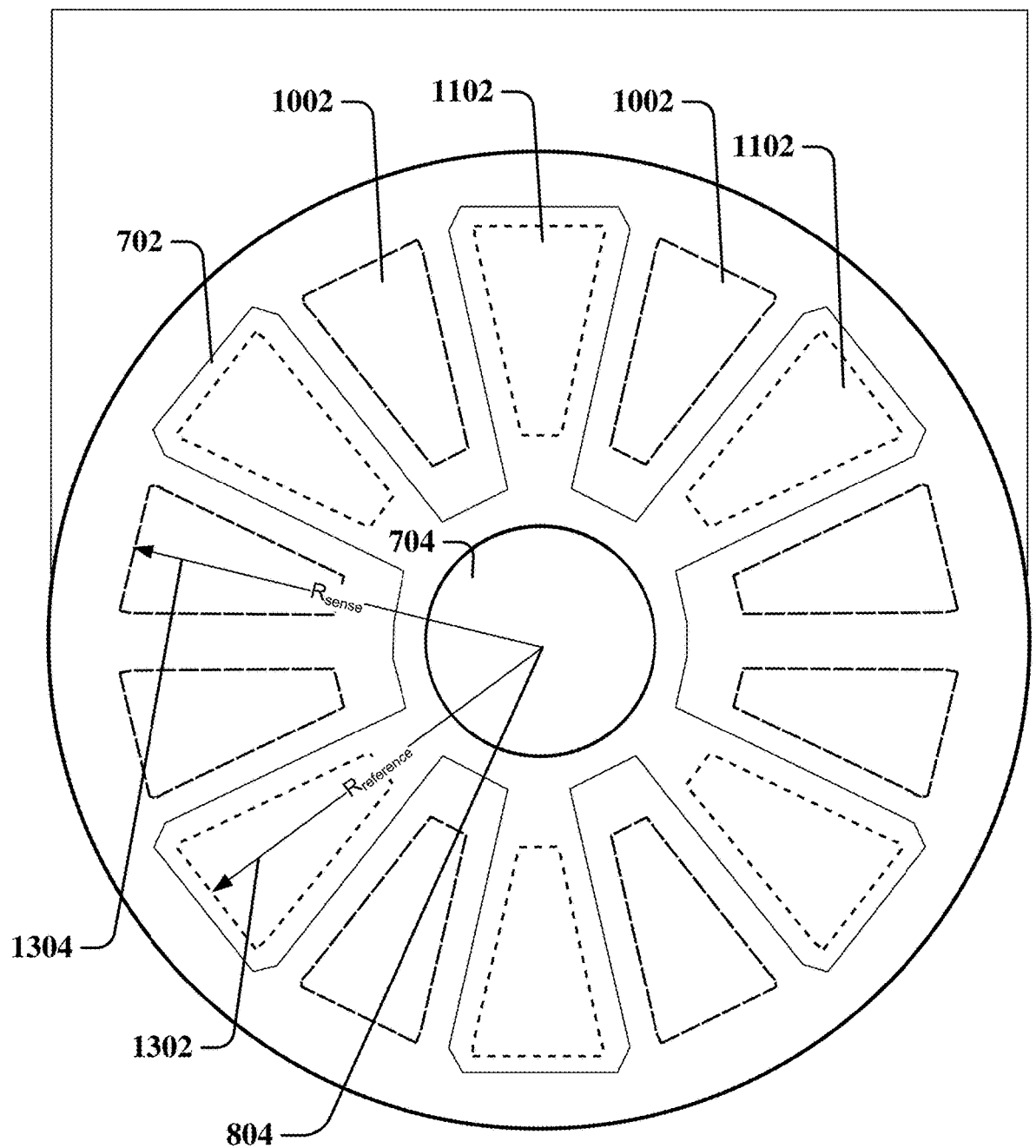
FIG. 13 shows still further non-limiting aspects of an exemplary apparatus directed to electrode configuration.

FIG. 13 shows still further non-limiting aspects of an exemplary apparatus directed to electrode configuration. For instance, in another non-limiting aspect of exemplary MEMS apparatus 700, the reference MEMS structure 702 can be anchored (e.g., via anchor 704) to the MEMS substrate (not shown) substantially in the center 804 of the reference MEMS structure 702 in the plane above the MEMS substrate, such as described above regarding FIGS. 2A-2B, such as described above regarding FIGS. 2A-2B. In addition, in another non-limiting aspect of exemplary MEMS apparatus 700, each of the plurality of the sense electrodes 1002 and each of the plurality of reference electrodes 1102 can be characterized by at least one of having substantially same area or extending an equivalent radial distance from a center of an anchor 704 that can be located substantially near the center 804 of the reference MEMS structure 702.

As depicted in FIG. 13, each of the sense electrodes 1002 associated with a respective arm or annular sector of the sensing MEMS structure 802 is configured as a corresponding annular sector, whereas each of the reference electrodes 1102 associated with a respective arm or annular sector of the sensing reference structure 702, is configured as a corresponding annular sector. Accordingly, in a non-limiting aspect, area associated with an annular sector of a sense electrode 1002 can be substantially the same as area associated with an annular sector of a reference electrode 1102, without limitation. In a further non-limiting aspect depicted in FIG. 13, each of the sense electrodes 1002 and each of the reference electrodes 1102 can extend an equivalent radial distance from a center of an anchor 704 (e.g., $R_{reference}$ 1302 is approximately equal to $R_{sense}$ 1304) that can be located substantially near the center 804 of exemplary reference MEMS structure 702.

Figure 14:
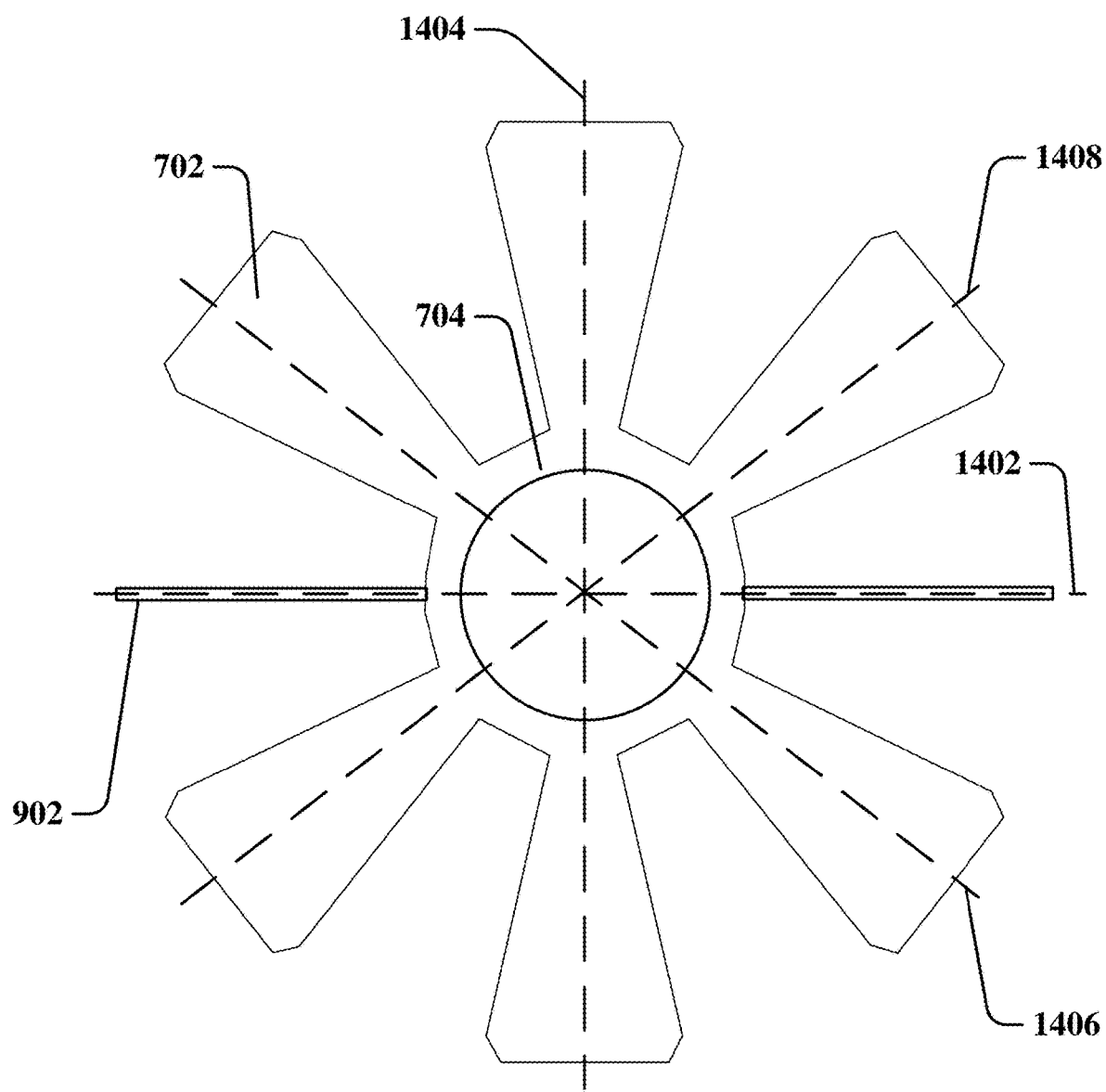
FIG. 14 depicts various aspects of an exemplary reference MEMS structure according to further non-limiting embodiments described herein.

FIG. 14 depicts various aspects of an exemplary reference MEMS structure 702 according to further non-limiting embodiments described herein. For instance, exemplary MEMS apparatus 700 can further comprise an exemplary flexible coupling 902 (e.g., an arrangement of one or more springs) that can be oriented substantially along a first axis of symmetry 1402 of the reference MEMS structure 702 that substantially intersects the center 804 of the reference MEMS structure 702 substantially in the plane above the MEMS substrate, such as described above regarding FIGS. 2A-2B. In another non-limiting aspect of exemplary MEMS apparatus 700, exemplary reference MEMS structure 702 can be symmetric about a second axis of symmetry in the plane above the MEMS substrate, such as described above regarding FIGS. 2A-2B. As a non-limiting example, exemplary reference MEMS structure 702 can be symmetric about the second axis of symmetry in the plane above the MEMS substrate, such as described above regarding FIGS. 2A-2B, and that is orthogonal to the first axis of symmetry 1402 (e.g., axis of symmetry 1404).

As described above regarding FIG. 12, a sum of the plurality of the reference electrodes 1102 and the plurality of the sense electrodes 1002 can be defined by a number of electrodes, n, where n equals 6+4x, and where x is equal to a selection of zero or a positive integer (e.g., 6, 10, 14, 18, . . . ). In yet another non-limiting aspect, exemplary reference MEMS structure 702 can be configured to have a number of axes of symmetry given by ((n+2)/4). In still another non-limiting aspect, exemplary reference MEMS structure 702 can be configured to have reference arms or annular sectors of the interdigitated set of arms 904 that lie on axes of symmetry of the reference MEMS structure 702 in the plane above the MEMS substrate (not shown), such as described above regarding FIGS. 2A-2B. In still another non-limiting aspect of exemplary MEMS apparatus 700, axes of symmetry (e.g., axes 1402, 1404, 1406, 1408, etc.) associated with exemplary reference MEMS structure 702 can be separated by equal angles.

Figure 15:
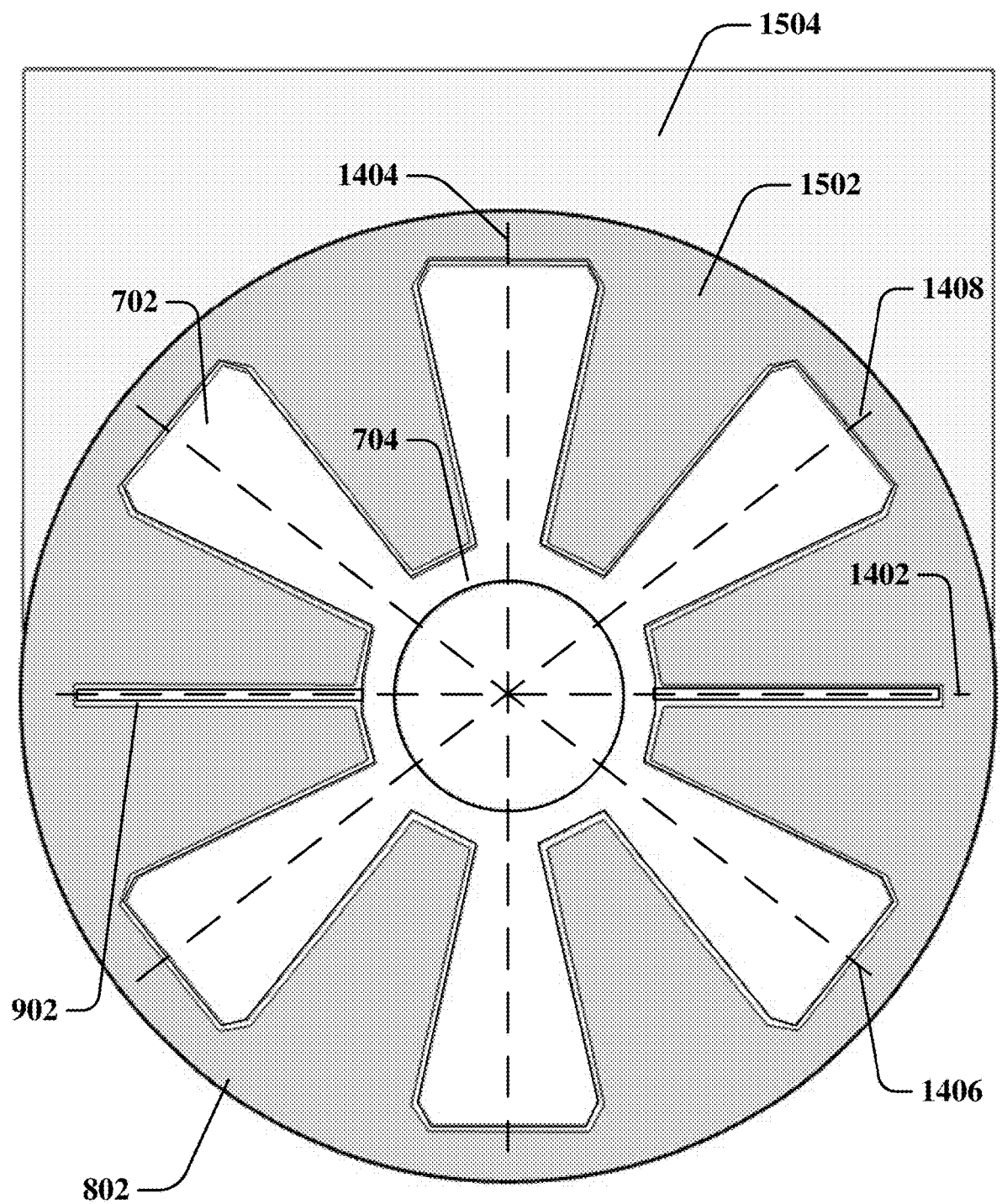
FIG. 15 depicts further non-limiting aspects of an exemplary MEMS sensing structure according to still other non-limiting embodiments.

FIG. 15 depicts further non-limiting aspects of an exemplary MEMS sensing structure 802 according to still other non-limiting embodiments. For instance, exemplary MEMS apparatus 700 can further comprise exemplary sensing MEMS structure 802 that can comprise a balanced sense mass 1502 and an unbalanced sense mass 1504. In another non-limiting aspect of exemplary MEMS apparatus 700, the balanced sense mass 1502 can be symmetric at least about the first axis of symmetry 1402 in the plane above the MEMS substrate (not shown), such as described above regarding FIGS. 2A-2B. In yet another non-limiting aspect of MEMS apparatus 700, the unbalanced sense mass 1504 can be symmetric at least about an axis of symmetry 1404 that is orthogonal to the first axis of symmetry 1402 in the plane above the MEMS substrate (not shown), such as described above regarding FIGS. 2A-2B.

Figure 16:
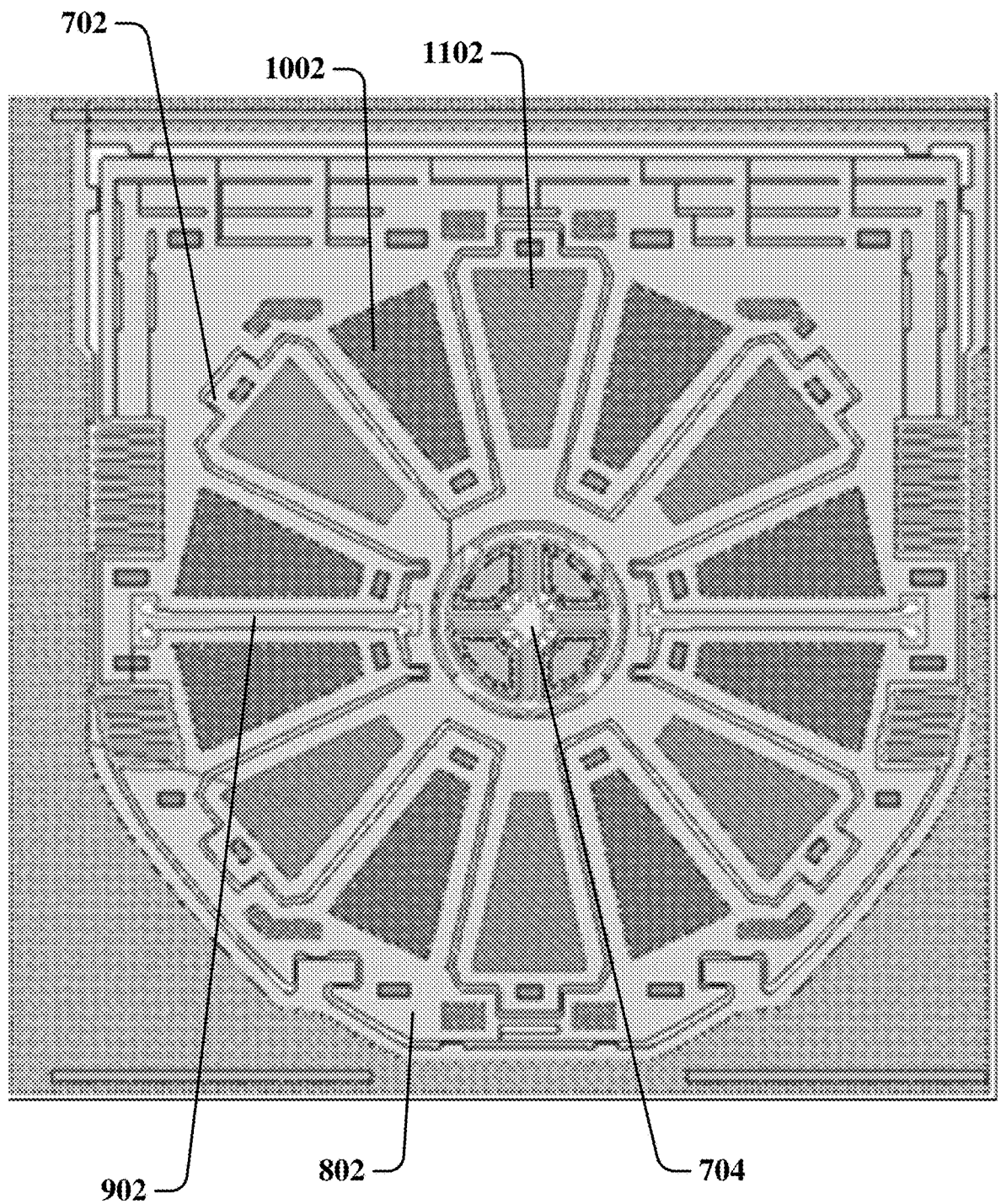
FIG. 16 depicts an exemplary embodiment of a tilting z-axis, out-of-plane sensing MEMS accelerometer, according to various aspects as described herein.

FIG. 16 depicts an exemplary embodiment of a tilting z-axis, out-of-plane sensing MEMS accelerometer, according to various aspects as described herein. What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such described embodiments.

As non-limiting examples, there may be other configurations that can be designed for offset stability improvement. Exemplary embodiments described above regarding FIGS. 7-15 allow MEMS structures above the electrodes to be symmetric about the axis orthogonal to the spring or flexible coupling axis and reference structure symmetry at least about two orthogonal axes, one of them being the spring or flexible coupling axis.

The disclosed subject matter facilitates improved offset in an exemplary MEMS structures and apparatuses employing a symmetric MEMS structure above the electrodes pattern, with multiple symmetry axes for substrate deformation rejection, where two of the symmetry axes being the axis about which the device is tilting (in case of tilting MEMS device structure), and its orthogonal symmetry axis.

The described non-limiting embodiments conceive of further improvements in offset minimization for a MEMS device based on increasing the number of electrodes, subject to consideration of process constraints, MEMS device robustness, overall structure gain, device footprint, and so on, as compensation or reference electrodes do not contribute to device gain. Thus, for obtaining devices having the same gain (e.g. the same area of sense electrodes), a device with increased compensation or reference electrodes will be necessarily bigger.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A microelectromechanical systems (MEMS) apparatus comprising:
   a reference MEMS structure located in a plane above a MEMS substrate, wherein the reference MEMS structure is anchored to the MEMS substrate;
   a sensing MEMS structure located substantially in the plane above the MEMS substrate, wherein the sensing MEMS structure is configured to move in response to an external load applied to the MEMS apparatus, wherein the reference MEMS structure and the sensing MEMS structure are each configured as respective sets of arms arranged as an interdigitated set of arms extending radially around a center of the reference MEMS structure;
   a flexible coupling configured to suspend the sensing MEMS structure above the MEMS substrate;
   a plurality of sense electrodes located parallel to the sensing MEMS structure configured to sense position of the sensing MEMS structure; and
   a plurality of reference electrodes located parallel to the reference MEMS structure configured to sense deformation of the MEMS substrate.

2. The apparatus of claim 1, wherein the reference MEMS structure is anchored to the MEMS substrate substantially in the center of the reference MEMS structure in the plane above the MEMS substrate.

3. The apparatus of claim 1, wherein each of the plurality of the sense electrodes and each of the plurality of reference electrodes are characterized by at least one of having substantially same area or extending an equivalent radial distance from a center of an anchor that is located substantially near the center of the reference MEMS structure.

4. The apparatus of claim 1, wherein the flexible coupling is oriented substantially along a first axis of symmetry of the reference MEMS structure that substantially intersects the center of the reference MEMS structure substantially in the plane above the MEMS substrate.

5. The apparatus of claim 4, wherein the sensing MEMS structure comprises a balanced sense mass and an unbalanced sense mass.

6. The apparatus of claim 5, wherein the balanced sense mass is symmetric at least about the first axis of symmetry in the plane above the MEMS substrate.

7. The apparatus of claim 5, wherein the unbalanced sense mass is symmetric at least about an axis of symmetry that is orthogonal to the first axis of symmetry in the plane above the MEMS substrate.

8. The apparatus of claim 4, wherein the reference MEMS structure is symmetric about a second axis of symmetry in the plane above the MEMS substrate.

9. The apparatus of claim 8, wherein the reference MEMS structure is symmetric about the second axis of symmetry in the plane above the MEMS substrate and that is orthogonal to the first axis of symmetry.

10. The apparatus of claim 1, wherein the interdigitated set of arms are configured in a circular arrangement around the center of the reference MEMS structure.

11. The apparatus of claim 1, wherein a quantity of the interdigitated set of arms associated with the reference MEMS structure is different than a quantity of the interdigitated set of arms associated with the sensing MEMS structure.

12. The apparatus of claim 11, wherein the quantity of the interdigitated set of arms associated with the reference MEMS structure is different than the quantity of the interdigitated set of arms associated with the sensing MEMS structure by two interdigitated arms.

13. The apparatus of claim 1, wherein each of the plurality of the reference electrodes and each of the plurality of the sense electrodes are associated with a respective arm within the interdigitated set of arms.

14. The apparatus of claim 1, wherein a quantity of the plurality of the reference electrodes is different than a quantity of the plurality of the sense electrodes.

15. The apparatus of claim 1, wherein a sum of the plurality of the reference electrodes and the plurality of the sense electrodes is at least six.

16. The apparatus of claim 15, wherein the sum is defined by a number of electrodes, n, where n equals 6+4x, and where x is equal to a selection of zero or a positive integer.

17. The apparatus of claim 16, wherein the reference MEMS structure has a number of axes of symmetry given by $((n+2)/4)$.

18. The apparatus of claim 1, wherein the plurality of the sense electrodes and the plurality of the reference electrodes are located beneath the plane above the MEMS substrate.

19. The apparatus of claim 1, wherein reference arms of the interdigitated set of arms that are associated with the reference MEMS structure lie on axes of symmetry of the reference MEMS structure in the plane above the MEMS substrate.

20. The apparatus of claim 19, wherein the axes of symmetry are separated by equal angles.

* * * * *